United States Patent [19]
Mori et al.

[11] Patent Number: 5,895,948
[45] Date of Patent: Apr. 20, 1999

[54] SEMICONDUCTOR DEVICE AND FABRICATION PROCESS THEREOF

[75] Inventors: Hidemitsu Mori; Toru Tatsumi; Hiromitsu Hada; Naoki Kasai, all of Tokyo, Japan

[73] Assignee: NEC Corporation, Tokyo, Japan

[21] Appl. No.: 08/936,919

[22] Filed: Sep. 25, 1997

[30]    Foreign Application Priority Data

Sep. 27, 1996 [JP] Japan .................... 8-256912

[51] Int. Cl.$^6$ .................... H01L 27/02; H01L 27/08
[52] U.S. Cl. .................... 257/306; 257/382; 257/628; 257/756
[58] Field of Search .................... 257/900, 296, 257/306, 307, 308, 382, 756, 628, 760

[56]    References Cited

U.S. PATENT DOCUMENTS

| | | | |
|---|---|---|---|
| 5,373,178 | 12/1994 | Motoyoshi et al. | 257/900 |
| 5,399,890 | 3/1995 | Okada et al. | 257/385 |
| 5,705,838 | 1/1998 | Jost et al. | 257/296 |
| 5,706,164 | 1/1998 | Jeng | 257/296 |
| 5,729,034 | 3/1998 | Park | 257/296 |
| 5,736,770 | 4/1998 | Asai et al. | 257/754 |
| 5,780,882 | 7/1998 | Sugiura et al. | 257/900 |

FOREIGN PATENT DOCUMENTS

| | | | |
|---|---|---|---|
| 60-10751 | 1/1985 | Japan | 257/296 |
| 61-31387 | 2/1986 | Japan | 257/296 |
| 3-49259 | 3/1991 | Japan | 257/29 |

OTHER PUBLICATIONS

H. Hada et al., "A Self-Aligned Contact Technology Using Anisotropical Selective Epitaxial Silicon For Giga–Bit DRAM", *IEDM*, 1995, pp. 665–668.

*Primary Examiner*—Donald L. Monin, Jr.
*Attorney, Agent, or Firm*—Sughrue, Mion, Zinn, Macpeak & Seas, PLLC

[57]    ABSTRACT

A silicon layer serving as a contact plug directly connected to a diffusion layer of a MOS transistor is provided. On a surface of an N$^-$ type diffusion layer in self-alignment with a silicon nitride layer spacer and a field oxide layer, an N$^+$ type monocrystalline silicon layer formed by anisotropic selective epitaxial growth method is directly connected. The surface of the N$^+$ type monocrystalline silicon layer is directly connected to an N$^+$ type monocrystalline silicon layer formed by isotropic selective epitaxial growth.

14 Claims, 14 Drawing Sheets

SEMICONDUCTOR DEVICE AND FABRICATION PROCESS THEREOF

BACKGROUND OF THE INVENTION

1. Field of the Invention

The present invention relates generally to a semiconductor device and a fabrication process thereof. More specifically the invention relates to a MOS transistor, in which connection between a diffusion layer and a wiring is established through a monocrystalline silicon layer provided in direct connection with the surface of a wiring layer.

2. Description of the Related Art

The increase in the package density of semiconductor device because of the decreasing size of semiconductor elements, the storage capacity of DRAMs is four times greater than the storage capacity of three years ago, for example. To obtain an increase in package density in the semiconductor device, it is essential to realize downsizing of not only the semiconductor elements per se but also wiring establishing mutual connections between the semiconductor elements as well as contact hole connecting the wiring and the semiconductor element. In view of demand for forming the semiconductor elements and contact hole at minimum dimensions defined in a current design rule at each timing, there have been proposed various structure for contact holes called as self-aligning type contact holes.

The inventors have presented new proposal for self-aligning type contact hole in paper of IEDM-95, pp 665 to 668 (Speech Number 27.4.1) in International Electron Devices Meeting, held in December 1995. The proposal is to form a monocrystalline silicon layer on an exposed surface of a diffusion layer provided on the surface of the silicon substrate which has major plane of {100} face, in self-aligned manner by way of anisotropic (not isotropic) selective epitaxial growth.

For example, anisotropic selective epitaxial growth of the monocrystalline silicon layer on an N-type diffusion layer is performed by means of ultra-high vacuum chemical vapor deposition: UHV-CVD) device in an order of $10^{-7}$ Pa. with employing disilane ($Si_2H_6$) and hydrogen phosphide ($PH_3$) as a primary material gas and doping gas at a temperature about 700° C. At this time, monocrystalline silicon layer primarily grown in <100> direction perpendicular to the major surface of the silicon substrate (in comparison with <110> direction).

After the foregoing report, the inventors have made study for an appropriate condition of anisotropic selective epitaxial growth on the basis of the foregoing report, and also has attempted to experimentally fabricate DRAM according to 0.25 µm design rule (minimum processing dimension; F=0.25 µm (250 nm)).

Further discussion will be given with reference to FIGS. 12 and 13 which are diagrammatic plan view and diagrammatic sectional view of DRAM. The shown DRAM fabricated by anisotropic selective epitaxial growth has COB structure, in which a bit line is located below a capacitor as will be discussed below. At this time, a mask alignment margin (=α) in a photolithographic process is approximately 50 nm.

Here, FIGS. 12A and 12B are a diagrammatic plane view of the multi-level semiconductor device, in which FIG. 12A shows a positional relationship between a gate electrode which also serves as an active region and a word line and a monocrystalline silicon layer, and FIG. 12B shows a positional relationship between a gate electrode and monocrystalline silicon layer, bit lines and storage node electrodes. Also, FIGS. 13A, 13B and 13C are diagrammatic sections taken along lines A—A, B—B and C—C of FIG. 12. It should be noted that, in FIGS. 12A and 12B, gate electrode and bit line are illustrated thinner than actual width for facilitating understanding of the positional relationship.

The major surface of P-type silicon substrate 301 is {100} face. A specific resistance of the P-type silicon substrate is about 5Ω·cm. An orientation flat of the silicon wafer forming the P-type silicon substrate 301 is an edge of <110> direction. An active region 302 on the surface of the P-type silicon substrate is surrounded by an isolation region which constituted of an LOCOS type field oxide layer 305 with a thickness of about 300 nm and a P⁻ type diffusion layer 304 (for serving as channel stopper and punch through stopper) provided on the bottom surface of the field oxide layer 305.

The active regions 302 is regularly arranged on the major plane of the P-type silicon substrate 301. Peripheral edge of the active region consists of a edge of <110> direction. In other words, the active region 302 is defined by the edge of <110> direction. The minimum width (channel width) and minimum interval of the active region 302 are both F (approximately 0.25 µm (250 nm)).

The gate electrodes 311 with a layer thickness of approximately 150 nm, which also serves as word lines, extend across the surface of an active region 302 via a gate oxide film 306 of thickness of approximately 8.5 nm provided on the surface of the active region 302 by thermal oxidation. At least in a region immediately above the active region 302, these gate electrodes 311 extend in perpendicular to the active region. The width (gate length), interval and wiring pitch of the gate electrodes 311 are respectively about F, F and 2F (=0.5 µm (500 nm)).

The gate electrode 311 is formed by stacking a tungsten silicide layer in a thickness of about 100 nm over an N⁺ type polycrystalline silicon layer in a thickness of about 50 nm. The N⁺ type polycrystalline silicon layer is formed through CVD method at a temperature about 700° C. using dichlorsilane ($SiH_2Cl_2$) as a material gas and hydrogen phosphide as doping gas. On the other hand, the tungsten silicide layer is formed by sputtering.

The upper surface of the gate electrode 311 is directly covered with a oxide silicon layer cap 312 with a thickness of about 70 nm. On the surface of the active region 302. N⁻ type diffusion layers 313a and 313b respective having about 100 nm of junction depth, in self-alignment with the gate electrodes 311 and the field oxide layer 305. These N⁻ type diffusion layers 313a and 313b are formed by ion implantation of about $2 \times 10^{13}$ cm⁻³ of phosphorous or arsenic at 30 keV.

The side surfaces of the gate electrode 311 and the oxide silicon layer cap 312 are directly covered with an oxide silicon layer spacer 314 in a thickness of about 50 nm (=d (=α)). The gate oxide layer 306 provided on the surface of the active region 302 is removed in self-align manner with respect to the field oxide layer 305 and the silicon oxide layer space 314 thereof to expose the surfaces of the N⁻ type diffusion layers 313a and 313b in these regions.

A width of the exposed surface in an alignment. direction of two gate electrodes 311 is about 150 nm (=F−2d). The width of the exposed surface in the portion disposed between the field oxide layers 305 is about 250 nm (=F). The silicon oxide layer forming the silicon oxide layer cap 312 is consisted of the silicon oxide layer formed in a thickness of about 100 nm by CVD methods initially. However, the layer thickness will becomes thinner in the step forming the silicon oxide layer spacer 314.

The height (about 230 nm from the major surface of the P-type silicon substrate 301) of the upper surface of the silicon oxide layer cap 312 at the position immediately above the active region 302 is lower than the height (about 370 nm from the major surface of the P-type silicon substrate) of the upper surface of the silicon oxide cap 312, in the extent of 140 nm.

The exposed surface of the N⁻ type diffusion layers 313a and 313b are directly covered with monocrystalline silicon layers 316a and 316b with a thickness of about 500 nm containing impurity in the content of about $1 \times 10^{19}$ cm$^{-3}$. In the exposed surface of the N⁻ type diffusion layers 313a and 313b, N⁺ type diffusion layers 315a and 315b having a (junction) depth in the extent of 70 nm, are provided. These N⁺ type diffusion layers 315a and 315b are formed by solid phase diffusion of phosphorous from respective of the monocrystalline silicon layers 316a and 316b.

Source and drain region 318a is constituted of the N⁻ type diffusion layer 313a, N⁺ type diffusion layer 315a and the monocrystalline silicon layer 316a, and source and drain region 318b is constituted of the N⁻ type diffusion layer 313b, N⁺ type diffusion layer 315b and the monocrystalline silicon layer 316b. These monocrystalline silicon layers 316a and 316b serve as contact pads for a node contact hole and a bit contact hole discussed later.

The major upper surfaces of these monocrystalline silicon layers 316a and 316b are constituted with {100} face perpendicular to the major surface of the P-type silicon substrate 301. The side surfaces of these monocrystalline silicon layers 316a and 316b are constituted of {110} face perpendicular to the major surface of the P-type silicon substrate 301. The monocrystalline silicon layers 316a and 316b are slightly extended over a portion in the vicinity of bird's beak and a portion in the vicinity of the upper end of the silicon oxide layer spacer 314.

The upper surface and the side surface of the monocrystalline silicon layers 316a and 316b do not directly intersect, in strict sense, but intersect via a facet (which is constituted by stacking terrace of silicon monoatomic layer forming {100} face parallel to the major surface of the P-type silicon substrate 301). It should be noted that, in the following discussion, discussion will be given assuming that the facet is included in a part of the upper surface unless otherwise mentioned specifically.

These monocrystalline silicon layers 316a and 316b are formed by employing the UHV-CVD device at a temperature of 625° C., under a pressure of about $1 \times 10^{-2}$ Pa, with disilane in a flow rate of 2.0 sccm and a doping gas (hydrogen phosphide diluted into 1% by hydrogen (H₂)) in a flow rate of 0.2 sccem.

At this time, a growth speed of {100} face of the monocrystalline silicon layers 316a and 316b parallel to (and perpendicular to) the major surface of the P-type silicon substrate 301 in <100> direction is about 10 nm/min. When the base layer is silicon oxide layer, the growth speed of {110} face of the monocrystalline silicon layers 316a and 316b in <110> direction is about one twentieth of the growth speed of {100} face in <100> direction.

A width extended over a portion in the vicinty of the upper end of the oxide silicon layer spacer 314 is about 10 nm to 25 nm (narrower than the mask alignment margin (α=50 nm).

Here, the peripheral edges of the active region 302 consists of the edges of <110> direction, and the gate electrode 311 extends across the active region 302 in <110> direction. Therefore, the monocrystalline silicon layers 316a and 316b grow mainly in <100> direction perpendicular to the major surface of the P-type silicon substrate 302. When <100> direction is included in the direction of the gate electrode 311 in the edge forming aethe peripheral edge of the active region 302 or the portion extending across the active region 302, the side surface of the monocrystalline silicon layer constituted of {100} face parallel to this direction also selectively grows in the direction perpendicular to this direction, and it is not desirable.

The P-type silicon substrate 301 including an N-channel MOS transistor is covered with a first interlayer insulation layer 321. The first interlayer insulation layer 321 is a silicon oxide type insulation layer, such as a stacked layer of silicon oxide layer and BPSG layer by CVD method, for example, and has a flattened upper surface by chemical mechanical polishing (CMP) or so forth. The layer thickness of the first interlayer insulation layer above the monocrystalline silicon layer 316a or so forth is about 300 nm, for example. In the first interlayer insulation layer 321, a bit contact hole 322 having a diameter of about F and reaching the monocrystalline silicon layer 316b through the interlayer insulation layer 321, is formed. The bit contact layer 322 is filled with a contact plug 323 of N⁺ type polycrystalline silicon layer, for example.

The bit lines 324 provided on the upper surface of the first interlayer insulation layer 321 a re directly connected to the contact plug 323 and thus connected to source and drain region 318b. These bit lines 324 is formed by a tungsten suicide layer in a thickness of about 120 nm, for example. The minimum width and minimum interval of the bit lines 324 are both approximately F. The width of the bit line 324 at a portion of the bit contact hole 322 is about 0.35 μm (=F+2α), and the wiring pitch of the bit lines 324 is about 0.6 μm (=2F+2α).

The first interlayer insulation layer 321 together with the bit lines 324 are covered with a second interlayer insulation layer 331. The second interlayer insulation layer 331 is also formed with silicon oxide type insulation layer. The thickness of the second interlayer insulation layer at the portion on the upper surface of the bit line 324 is about 300 nm. The upper surface of the second interlayer insulation layer 331 is also planarized.

Node contact holes 332 having diameters of approximately F and extending through the first and second interlayer insulation layers 321 and 331 reach the monocrystalline silicon layer 316a. The node contact holes 332 are filled with contact plugs 333 consisted of N⁺ type polycrystalline silicon layers, for example. Storage node electrodes 334 provided on the upper surface of the second interlayer insulation layer 331 is consisted of N⁺ type polycrystalline silicon layers having a layer thickness of about 800 nm. The storage node electrodes 334 are directly connected to the contact plugs 333 and thus connected to a source and drain region 318a.

The interval and minimum width of each of these storage electrodes 334 are about F and F+2α, respectively. The upper surface and the side surface of the storage node electrode 334 and at least a part of the second interlayer insulation layer 331 are directly covered with a capacitive insulation layer 335 consisted of a stacked film (so called ONO film), in which silicon oxide layer, silicon nitride layer and silicon oxide layer are stacked in sequential order. The layer thickness of the capacitive insulation layer 335 as converted into the layer thickness of the silicon oxide layer is about 5 nm.

The surface of the capacitive insulation layer 335 is directly covered with a cell plate electrode 336 of N⁺ type polycrystalline silicon layer having a thickness of about 150 nm, for example. The surface of the cell plate electrode 336 is directly covered with a surface protective layer 341 consisted of the silicon oxide type insulation layer. The layer thickness of the surface protective layer 341 immediately above the storage node electrode 334 is about 300 nm.

If the monocrystalline silicon layers 316a and 316b of the foregoing DRAM are formed by known isotropic selective epitaxial growth method, since the interval between the N⁻ type diffusion layer 313a is about 350 nm, an interval of the monocrystalline silicon layer serving as the contact pad for the node contact hole becomes too narrow to certainly obtain necessary height to serve as the contact pad. It is preferred that the height of the contact pad is higher than at least the upper surface of the silicon oxide layer cap 312.

In contrast to this, the monocrystalline silicon layer formed by anisotropic selective epitaxial growth set forth above has higher growth speed of the {100} face in <100> direction in comparison with the growth speed of {110} face in <110> direction. Therefore, as shown in FIGS. 12a and 12B and other figure, it is facilitated to provide necessary interval between the monocrystalline silicon layer 316a and the monocrystalline silicon layer 316b and between two adjacent monocrystalline silicon layers 316a so as to avoid possibility of occurrence of shorting.

However, associated with that nature of the anisotropic selective epitaxial growth that growth speed of the {100} face in <100> direction is higher than the growth speed of {110} face in <110> direction, a new problem is encountered. Such problem will be discussed with reference to the diagrammatic illustration in FIG. 14.

In the anisotropic epitaxial growth, the growth speed of the {110} face in <110> direction is about one twentieth of the growth speed of the {100} face in <100> direction. Therefore, after the upper surfaces of the monocrystalline silicon layers 316a and 316b reach in the vicinity of the upper end portion of the silicon oxide layer spacer 314, growth of the {110} faces of the monocrystalline silicon layers 316a and 316b in <110> direction is initiated.

As a result, an overlapping width of the monocrystalline silicon layers 316a and 316b over the a portion in the vicinity of the upper end portion of the silicon oxide layer spacer 314 (further over the upper surface of the silicon oxide layer cap 312) becomes narrower than the overlapping width of the monocrystalline silicon layers 316a and 316b over the upper surface of the field oxide layer 305.

In such condition, when the node contact hole 322 is to be formed, unless an offset δ (which should be $0 \leq \delta \leq \alpha$) of mask alignment is zero, the upper end portion of the silicon oxide layer 314 and part of the silicon oxide layer cap 312 can be removed by etching to form locally thin portions of the silicon oxide layer cap 312 and the silicon oxide layer spacer 314 covering the gate electrode 311, and furthermore, a part of the gate electrode 311 is exposed to the bottom of the node contact hole 322.

In order to enable the monocrystalline silicon layer 316a and so forth to satisfactorily serve as the contact pads, it is essential that only upper surface of the monocrystalline silicon layers 316a or so forth are exposed to the bottom of the node contact hole 322 or so forth. Accordingly, in this case, the monocrystalline silicon layer 316a or so forth becomes insufficient to serve as the contact pads. For this reason, leak current between the source and drain region (storage node electrode of the capacitor in this case) and the gate electrode can be increased and further can cause shorting therebetween.

It should be noted that, in this case, it becomes as possible to certainly provide sufficient overlapping width of the monocrystalline silicon layer corresponding to a mask alignment margin (α) on the silicon oxide layer cap 312 by providing the monocrystalline silicon layer of the layer thickness of about 2 μm by anisotropic selective epitaxial growth, for example. However, the monocrystalline silicon layer having such height is not practical and should cause problems in workability and so forth in the prior art process.

SUMMARY OF THE INVENTION

Accordingly, it is an object of the present invention to provide a semiconductor device and a fabrication process thereof, having a diffusion layer and a source and drain region including a monocrystalline silicon layer serving as a contact pad provided on a surface of the diffusion layer in self-aligned manner, which semiconductor device facilitates prevention of leak current and shorting between wiring connected to the source and drain region via the contact hole and a gate electrode and will not cause the problems of the prior art process.

According to the first aspect of the invention, a semiconductor device comprises:

an active region defined by an edge of <110> direction provided on the surface of one conductivity type silicon substrate having a major surface consisted of {100} face;

a localized oxidation of silicon type field oxide layer provided in an isolating region of the surface of the silicon substrate surrounding the active region;

a gate electrode extending across the surface of the active region in <110> direction via a gate oxide layer provided on the surface of the active region;

a silicon oxide layer cap directly covering the upper surface of the gate electrode;

a silicon nitride layer spacer directly covering the side surface of the gate electrode and the silicon oxide layer cap;

a reverse conductivity type source and drain region being constituted of a reverse conductivity type diffusion layer provided on the surface of the active region in self-alignment with the gate electrode and the field oxide layer, a first silicon layer of reverse conductivity type monocrystalline silicon, directly covering the surface of the reverse conductive type diffusion layer in self-alignment with the silicon nitride layer spacer and the field oxide layer and having a side surface consisted of {110} face and an upper surface consisted of {100} face as major surface, and a reverse conductivity type second silicon layer directly covering the upper surface and the side surface of the first silicon layer and extending at least over the upper surface of the silicon oxide layer cap and the field oxide layer;

an interlayer insulation layer covering the field oxide layer, the silicon oxide layer cap, the silicon nitride spacer and the second silicon layer;

a contact hole provided through the interlayer insulation layer and reaching the upper surface of the second silicon layer; and a wiring provided on the surface of the interlayer insulation layer and connected to the source and drain region via the contact hole.

According to the second aspect of the invention, a semiconductor device comprises:

an active region defined by an edge of <110> direction provided on the surface of one conductivity type silicon substrate having a major surface consisted of {100} face;

a groove provided in an isolating region on the surface of the silicon substrate surrounding the active region;

a field insulation layer filled in the groove;

a gate electrode extending across the surface of the active region in <110> direction via a gate oxide layer provided on the surface of the active region;

a silicon oxide layer cap directly covering the upper surface of the gate electrode;

a silicon nitride layer spacer directly covering the side surface of the gate electrode and the silicon oxide layer cap;

a reverse conductivity type source and drain region being constituted of a reverse conductivity type diffusion layer provided on the surface of the active region in self-alignment with the gate electrode and the field oxide layer, a first silicon oxide layer of reverse conductivity type monocrystalline silicon, directly covering the surface of the reverse conductive type diffusion layer in self-alignment with the silicon nitride layer spacer and the field oxide layer and having a side surface consisted of {110} face and an upper surface consisted of {100} face as major surface, and a reverse conductivity type second silicon layer directly covering the upper surface and the side surface of the first silicon layer and extending at least over the upper surface of the silicon oxide layer cap and the field oxide layer;

an interlayer insulation layer covering the field oxide layer, the silicon oxide layer cap, the silicon nitride spacer and the second silicon layer;

a contact hole provided through the interlayer insulation layer and reaching the upper surface of the second silicon layer; and a wiring provided on the surface of the interlayer insulation layer and connected to the source and drain region via the contact hole.

In the construction set forth above, the second silicon layer may be formed of a monocrystalline silicon. The minimum interval of the gate electrode and minimum diameter of the contact hole may be equal to each other. The minimum interval of the silicon nitride layer spacer belonging in adjacent gate electrodes and the minimum diameter of the contact hole may be equal to each other.

According to the third aspect of the invention, a fabrication process of a semiconductor device comprises:

step of forming a localized oxidation of silicon type field oxide layer in an isolating region surrounding an active region defined by an edge of <110> direction provided on the surface of one conductivity type silicon substrate having a major surface consisted of {100} face;

step of forming a gate oxide layer on the surface of the active region by thermal oxidation;

step of forming a conductive layer over the entire surface;

step of forming a silicon oxide layer covering the conductive layer;

step of forming a gate electrode extending across the surface of the active region in <110> direction via the gate oxide layer and a silicon oxide layer cap directly covering the upper surface of the gate electrode by patterning the silicon oxide layer and the conductive layer;

step of forming a reverse conductivity type diffusion layer on the surface of the active region, taking the gate electrode and the field oxide layer as a mask;

step of forming a silicon nitride layer over the entire surface;

step of performing etching back for the silicon nitride layer by anisotropic etching to form a silicon nitride layer spacer directly covering the silicon oxide layer cap and the side surface of the gate electrode;

step of removing the gate oxide layer in self-alignment with the silicon nitride layer spacer and the field oxide layer;

step of forming a first silicon layer of reverse conductivity type monocrystalline silicon on the surface of the reverse conductive type diffusion layer by anisotropic selective epitaxial growth of monocrystalline silicon;

step of forming a reverse conductivity type second silicon layer directly covering the upper surface and the side surface of the first silicon layer and extending at least over the upper surface of the silicon oxide layer cap and the field oxide layer, by isotropic selective epitaxial growth method of monocrystalline silicon or selective growth method of polycrystalline silicon;

step of forming an interlayer insulation layer over the entire surface;

step of forming a contact hole through the interlayer insulation layer, the contact hole reaching the upper surface of the second silicon layer; and step of forming a wiring on the surface of the interlayer insulation layer and the wiring being connected to the source and drain region via the contact hole.

According to the fourth aspect of the invention, a fabrication process of a semiconductor device comprises:

step of forming a groove in an isolating region surrounding an active region defined by an edge of <110> direction provided on the surface of one conductivity type silicon substrate having a major surface consisted of {100} face;

step of forming a field insulation layer by forming an insulation layer over the entire surface and removing the insulation layer, leaving the insulation layer within the groove;

step of forming a gate oxide layer on the surface of the active region by thermal oxidation;

step of forming a conductive layer over the entire surface;

step of forming a silicon oxide layer covering the conductive layer;

step of forming a gate electrode extending across the surface of the active region in <110> direction via the gate oxide layer and a silicon oxide layer cap directly covering the upper surface of the gate electrode by patterning the silicon oxide layer and the conductive layer;

step of forming a reverse conductivity type diffusion layer on the surface of the active region, taking the gate electrode and the field insulation layer as a mask;

step of forming a silicon nitride layer over the entire surface;

step of performing etching back for the silicon nitride layer by anisotropic etching to form a silicon nitride layer spacer directly covering the silicon oxide layer cap and the side surface of the gate electrode;

step of removing the gate oxide layer in self-alignment with the silicon nitride layer spacer and the field insulation layer;

step of forming a first silicon layer of reverse conductivity type monocrystalline silicon on the surface of the reverse conductive type diffusion layer by anisotropic selective epitaxial growth of monocrystalline silicon;

step of forming a reverse conductivity type second silicon layer directly covering the upper surface and the side surface of the first silicon layer and extending at least over the upper surface of the silicon oxide layer cap and the field insulation layer, by isotropic selective epitaxial growth method of monocrystalline silicon or selective growth method of polycrystalline silicon;

step of forming an interlayer insulation layer over the entire surface;

step of forming a contact hole through the interlayer insulation layer, the contact hole reaching the upper surface of the second silicon layer; and step of forming a wiring on the surface of the interlayer insulation layer and the wiring being connected to the source and drain region via the contact hole.

In the preferred process, anisotropic selective epitaxial growth may be performed with taking disilane ($Si_2H_6$) or mono silane ($SiH_4$) as a primary material gas. The second silicon layer may be formed by isotropic selective epitaxial growth method of monocrystalline silicon employing the same primary material gas as the first silicon layer, and a growth temperature of the second silicon layer is lower than a growth temperature of the first silicon layer.

BRIEF DESCRIPTION OF THE DRAWINGS

The present invention will be understood more fully from the detailed description given herebelow and from the accompanying drawings of the preferred embodiment of the present invention, which, however, should not be taken to limit to the invention, but are for explanation and understanding only.

In the drawings:

FIGS. 5A and 5B are charts for explaining anisotropic selective epitaxial growth method applicable for the first embodiment of the semiconductor device, in which FIG. 5A is a graph showing dependency of growth speed of {100} face in <100> direction relative to a flow rate of disilane, and FIG. 5B is a graph showing a dependency of growth speed of {110} face in <110> direction relative to a flow rate of disilane;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1A:
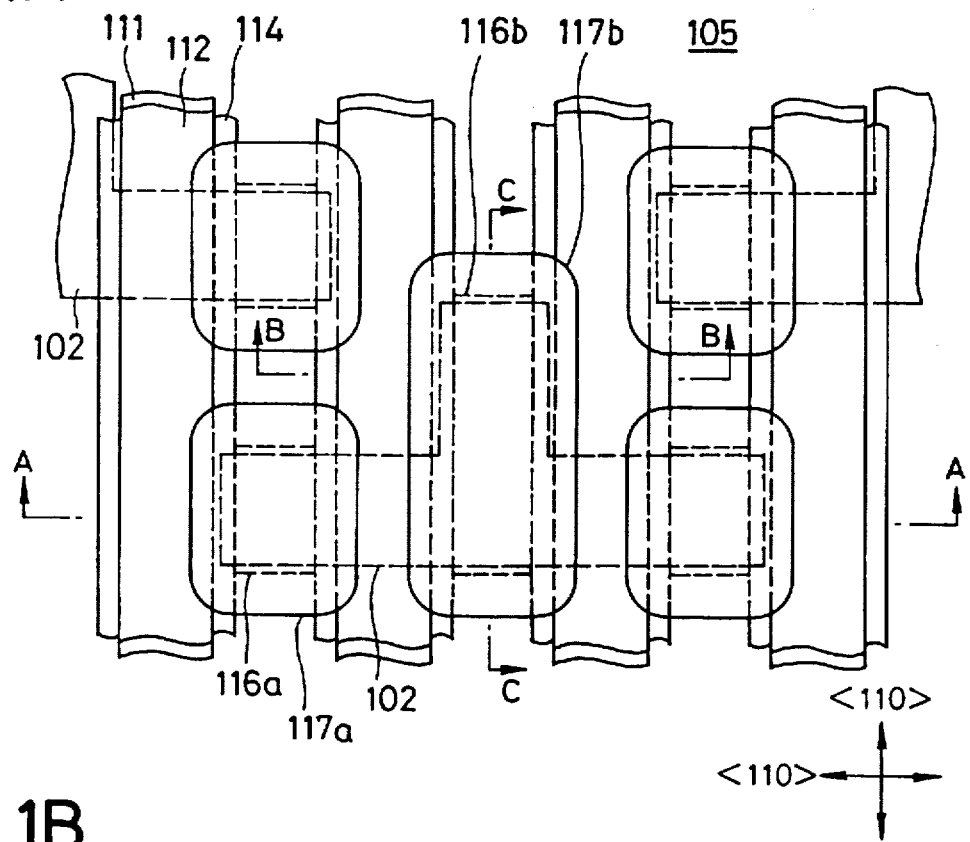
FIGS. 1A and 1B are diagrammatic plan view of the first embodiment of a semiconductor device according to the present invention.
Figure 1B:
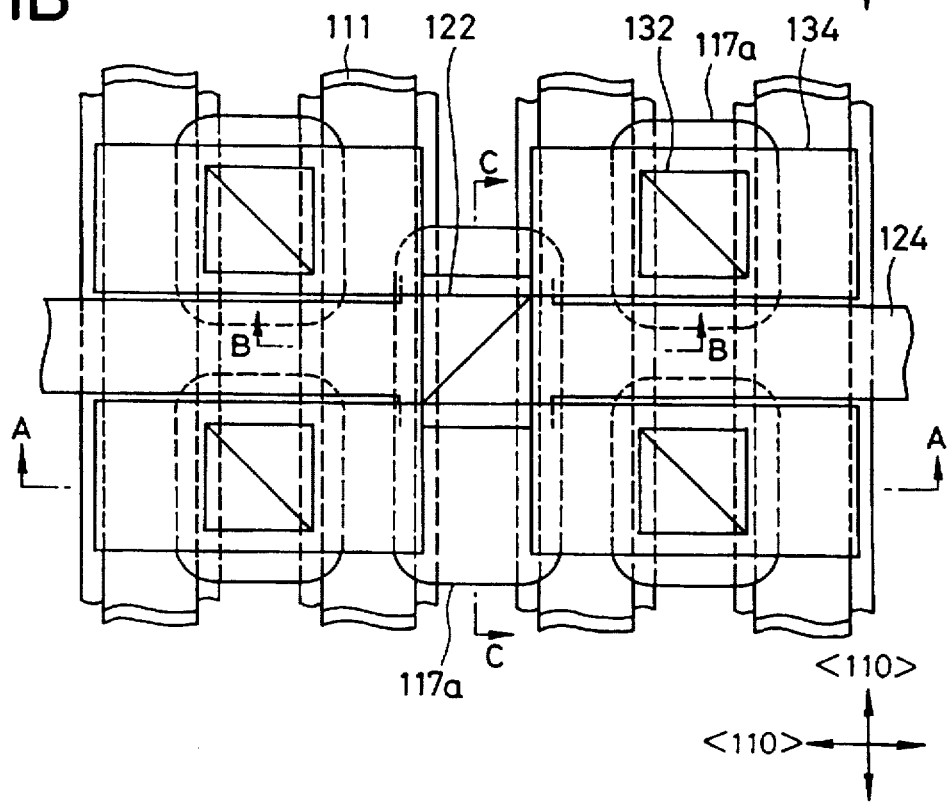
Figure 2A:
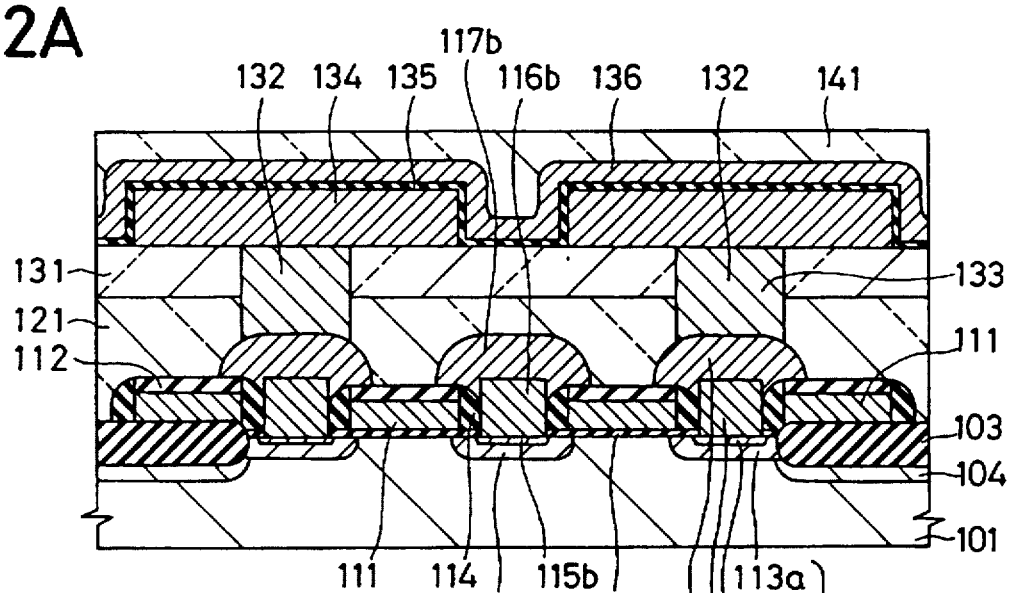
FIGS. 2A to 2C are diagrammatic sections of the first embodiment of the semiconductor device, respectively taken along lines A—A, B—B and C—C of FIGS. 1A and 1B.
Figure 2B:
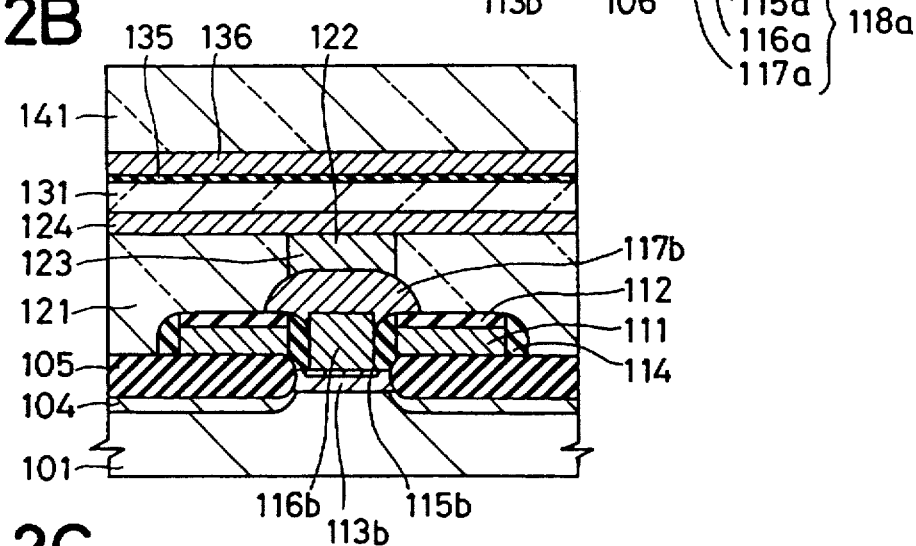
Figure 2C:
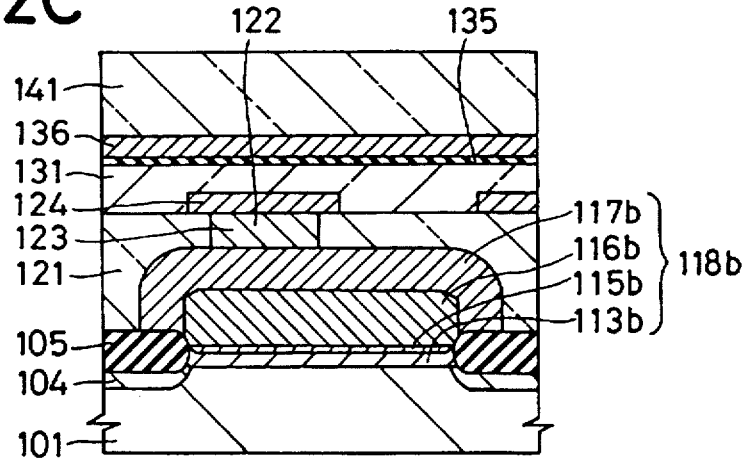
Figure 3A:
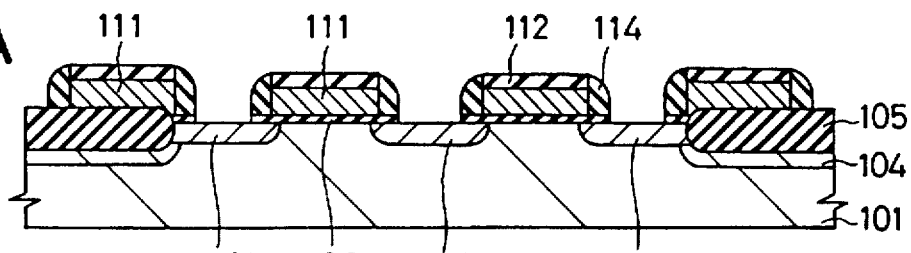
FIGS. 3A to 3E are diagrammatic sections showing fabrication process of the first embodiment of the semiconductor device, taken along line A—A of FIGS. 1A and 1B.
Figure 3B:
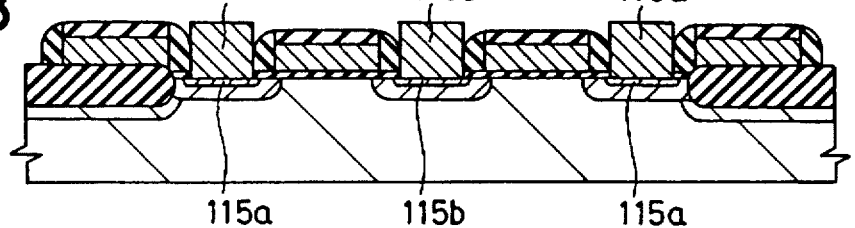
Figure 3C:
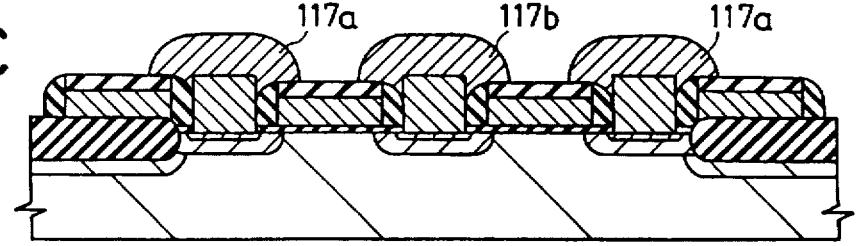
Figure 3D:
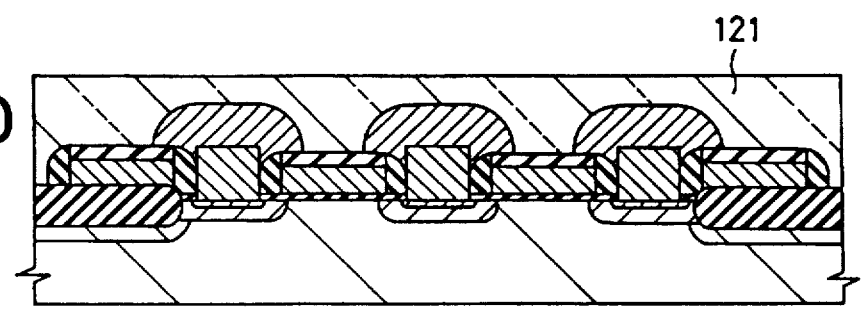
Figure 3E:
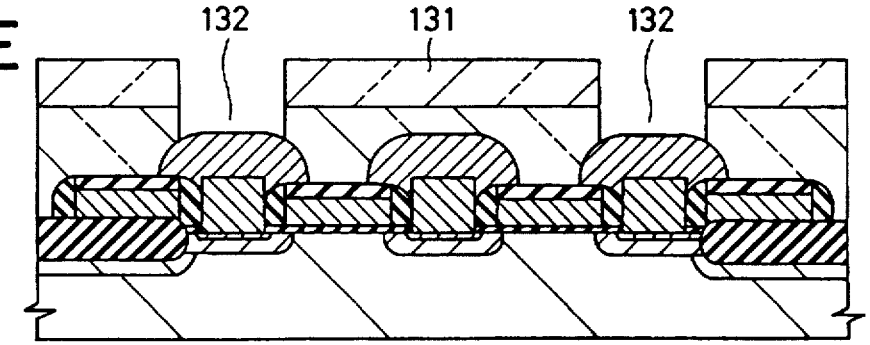
Figure 4A:
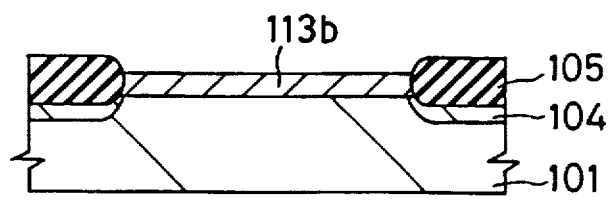
FIGS. 4A to 4E are diagrammatic sections showing fabrication process of the first embodiment of the semiconductor device, taken along line C—C of FIGS. 1A and 1B.
Figure 4B:
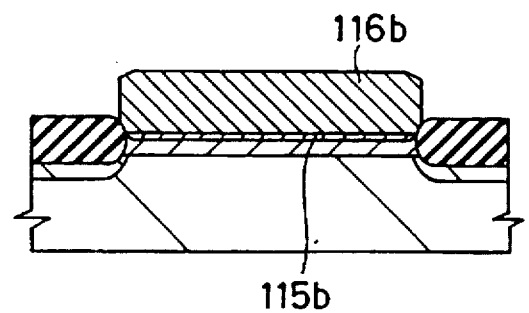
Figure 4C:
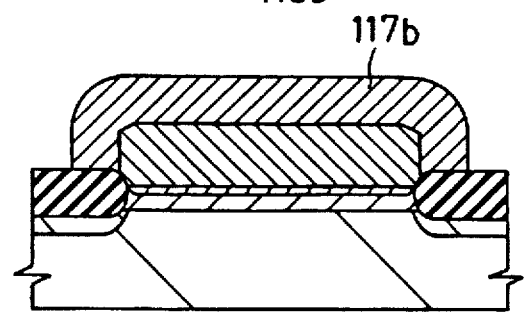
Figure 4D:
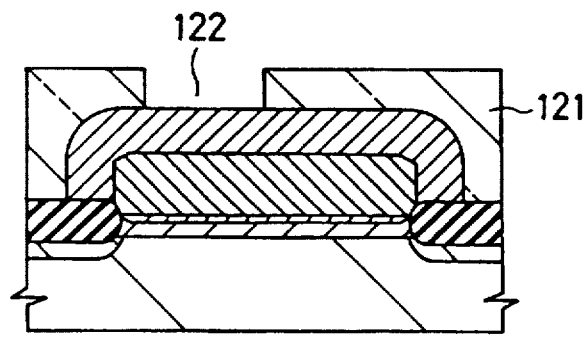
Figure 4E:
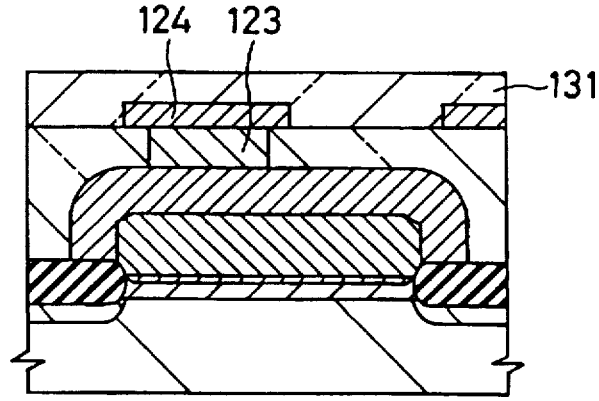

Referring to FIGS. 1A to 2C which are respectively diagrammatic plan view and diagrammatic sections of DRAM, to which the first embodiment of a semiconductor device according to the present invention, is applied for a DRAM in COB structure. The DRAM is fabricated based on 0.25 μm design rule (minimum processing dimension; F=0.25 μm (250 nm)) under a mask alignment margin a of about 50 nm, and constructed as follow. FIGS. 1A and 1B are diagrammatic plan view at different levels, in which FIG. 1A illustrates positional relationship between an active region and a second (monocrystalline) silicon layer consisted of gate electrodes also serving as word lines and an $N^+$ type monocrystalline silicon, and FIG. 1B illustrates positional relationship between the gate electrodes and the second (monocrystalline) silicon layer, bit lines, and storage node electrodes. On the other hand, FIGS. 2A, 2B and 2C are diagrammatic sections taken along lines A—A, B—B and C—C of FIG. 1.

It should be noted that, in FIGS. 1A and 1B, gate electrode and bit line are illustrated thinner than actual width for facilitating understanding of the positional relationship.

The major surface of P-type silicon substrate 101 is {100} face. A resistivity of the P-type silicon substrate 101 is about 5 Ω·cm. An orientation flat of the silicon wafer forming the P-type silicon substrate consists of an edge of <110> direction. An active region 102 on the surface of the P-type silicon substrate is surrounded by an isolation region which is constituted of an LOCOS type field oxide layer 105 and a P⁻ type diffusion layer 104 provided on the bottom surface of the field oxide layer 105 (for serving as channel stopper and punch through stopper).

These active regions 102 are regularly arranged on the major plane of the P-type silicon substrate 101. Peripheral edge of the active region is in the <110> direction. In other words, the active region 102 is defined by the edge of <110> direction. The minimum width (≈channel width) and minimum interval of the active region 102 are both F (approximately 0.25 µm (250 nm)).

The gate electrodes 111 in a layer thickness of approximately 150 nm, which also serves as word lines, extend across the surface of an active region 102 via a gate oxide film 306 of thickness of approximately 8.5 nm provided on the surface of the active region 102. At least in a region immediately above the active region 102, these gate electrodes 111 extend in perpendicular to the active region 102. The width (gate length), interval and wiring pitch of the gate electrodes 311 are respectively about F, F and 2F (=0.5 µm (500 nm)). The gate electrode 111 is formed by stacking a tungsten silicide layer in a thickness of about 100 nm over an $N^+$ type polycrystalline silicon layer in a thickness of about 50 nm.

The upper surface of the gate electrode 111 is directly covered with a oxide silicon layer cap 112 in a thickness of about 70 nm. On the surface of the active region 102, $N^-$ type diffusion layers 113a and 113b respective having about 100 nm of junction depth, in self-alignment with the gate electrodes 111 and the field oxide layer 105.

The side surfaces of the gate electrode 111 and the oxide silicon layer cap 112 are directly covered with an oxide silicon layer spacer 114 in a thickness of about 50 nm (=d (=α)). The gate oxide layer 106 provided on the surface of the active region 102 is removed in self-aligned manner with respect to the field oxide layer 105 and the silicon oxide layer space 114 thereof to expose the $N^-$ type diffusion layers 113a and 113b to the surface.

A width of the exposed surface in an alignment direction of two gate electrodes 111 is about 150 nm (=F−2d). The width of the exposed surface in the portion disposed between the field oxide layers 105 is about 250 nm (=F). The height (about 230 nm from the major surface of the P-type silicon substrate 101) of the upper surface of the silicon oxide layer cap 112 at the position immediately above the active region 102 is lower than the height (about 370 nm from the major surface of the P-type silicon substrate) of the upper surface of the silicon oxide cap 112, in the extent of 140 nm.

The exposed surface of the $N^-$ type diffusion layers 113a and 113b are directly covered with monocrystalline silicon layers 116a and 116b containing impurity in the content of about $1\times10^{18}$ cm$^{-3}$.

The $N^+$ type monocrystalline silicon layers 116a and 116b (while detail will be discussed later) are formed by anisotropic selective epitaxial growth method. The height (layer thickness) of the monocrystalline silicon layers 116a and 116b is preferred not to be lower than at least the height (about 370 nm) of the silicon oxide layer cap 112 covering the gate electrode in the portion provided on the surface of the field oxide layer 105.

In the exposed surface of the $N^-$ type diffusion layers 113a and 113b, $N^+$ type diffusion layers 115a and 115b having a (junction) depth in the extent of 70 nm, are provided. These $N^+$ type diffusion layers 115a and 115b are formed by solid phase diffusion of phosphorous from respective of the monocrystalline silicon layers 116a and 116b. The monocrystalline silicon layer 116a extends in a width about 20 nm in the vicinity of bird's beak of the field oxide layer 105 (in a form directly covering the upper surface of the field oxide layer 105), and extends in a width from less than 10 nm to greater than 20 nm in the vicinity of the upper end of the silicon nitride layer cap 114 (in a form directly covering the upper end portion of the silicon nitride layer cap 114).

The monocrystalline silicon layer 116b extend in a width of about 20 nm in the vicinity of the bird's beak of the field oxide layer 105, and extends in a width greater than 20 nm in the vicinity of the upper end of the silicon nitride layer cap 114. The upper surfaces of the monocrystalline silicon layers 116a and 116b are mainly consisted of {100} face parallel to the major surface of the P-type silicon substrate 101. The side surfaces of the monocrystalline silicon layers 116a and 116b are in the direction of a {110} face perpendicular to the major surface of the P-type silicon substrate 101.

In the shown first embodiment, a facet forming the upper surface in the vicinity of the intersection of the side surface and the upper surface of the monocrystalline silicon layers 116a and 116b is present only in the vicinity of the intersection of the side surface on the side of the field oxide layer 105, in general.

The upper surface and the side surface of the monocrystalline silicon layers 116a and 116b are directly covered with $N^+$ type monocrystalline silicon layers 117a and 117b (as second silicon layers) in the extent of 100 nm in the layer thickness, for example. These monocrystalline layers 117a and 117b are formed by isotropic selective epitaxial growth method (detail will be discussed later).

The monocrystalline silicon layer 117a extends in width about 100 nm on the upper surface of the field oxide layer 105 (in the width about 120 nm as added monocrystalline silicon layer 116a) (in a form directly covering the upper surface of the field oxide layer 105) to cover the portion in the vicinity of the upper end of the silicon nitride layer cap 114 and extends in a width about 70 nm on the upper surface of the silicon oxide layer cap 112.

The monocrystalline silicon layer 117b also extends in a width of about 100 nm on the upper surface of the field oxide layer 105 to directly cover the portion in the vicinity of the upper end of the silicon nitride layer cap 114, and extends in a width about 70 nm on the upper surface of the silicon oxide layer cap 112. An interval of adjacent two monocrystalline silicon layers 117a is about 110 nm, and the interval between the monocrystalline silicon layer 117a and the monocrystalline silicon layer 117b is about 110 nm.

It should be noted that, in the shown first embodiment, the second silicon layer is not limited to the foregoing $N^+$ type monocrystalline silicon layers 117a and 117b but may be constructed with $N^+$ type polycrystalline silicon formed by selective growth.

In the first embodiment, a source and drain region 118a is constructed with an $N^-$ type diffusion layer 113a, an $N^+$ type diffusion layer 115a, the monocrystalline silicon layer 116a and the monocrystalline silicon layer 117a.

A source and drain region 118b is constructed with an $N^-$ type diffusion layer 113b, an $N^+$ type diffusion layer 115b, the monocrystalline silicon layer 116b and the monocrystalline silicon layer 117b. An N-channel MOS transistor formed on the major surface of the P-type silicon substrate 101 is constructed with a gate oxide layer 106, a gate electrode 111 and the source and drain regions 118a and 118b.

An interval of adjacent monocrystalline silicon layers 117a and an interval between the monocrystalline silicon layers 117a and 117b are both about 110 nm. Interval between adjacent source and drain regions 118a and interval between the source and drain region 118a and the source and drain region 118b sufficient for insulation can be certainly provided.

The P-type silicon substrate 101 including an N-channel MOS transistor is covered with a first interlayer insulation layer 121. The first interlayer insulation layer 121 is constituted of a silicon oxide type insulation layer, such as a stacked layer of silicon oxide layer and BPSG layer formed by CVD method, for example, and has an upper surface planarized by chemical mechanical polishing (CMP) or so forth.

The layer thickness of the interlayer insulation layer 121 on the upper surface of the monocrystalline silicon layers 117a and 117b is about 300 nm, for example. In the interlayer insulation layer 121, a bit contact hole 122 having a diameter of about F is provided to reach the monocrystalline silicon layer 117b. These bit contact hole 122 is filled with a contact plug 123 of $N^+$ type polycrystalline silicon layer, for example.

The bit line 124 provided on the upper surface of the interlayer insulation layer 121 is directly connected to the contact plug 123, and connected to the source and drain region 118b. These bit lines 124 are formed with tungsten silicide layer in a thickness of 120 nm. The minimum width and minimum interval of the bit line 124 are both about F. The line width of the bit line 124 in the portion of the contact hole 122 is about 350 nm (=F+2α), and the wiring pitch of the bit line 124 is about 600 nm (=2F+2α).

In the shown first embodiment, the width of the monocrystalline silicon layer 117b at the portion reaching the bit contact hole 122 is about 390 nm (>350 nm (=2F+2α)). Therefore, the bottom of the bit contact hole 122 is consisted only by the upper surface of the monocrystalline silicon layer 117b so that it may satisfactorily serve as the contact pad for the bit contact hole 122.

Namely, the bottom of the bit contact hole 122 may not directly reach the silicon oxide layer cap 112 or the silicon nitride layer spacer 114. Also, it can be avoided to expose the upper surface of the gate electrode 111 in the bottom of the bit contact hole 122. Therefore, a leak current and shorting of the bit line 124 (also the source and drain region 118b) and gate electrode 111 can be easily restricted.

The first interlayer insulation layer 121 and the bit line 124 are covered with a second interlayer insulation layer 131. The second interlayer insulation layer 131 is also formed with a silicon oxide type insulation layer. The layer thickness of the second insulation layer on the upper surface of the bit line 124 is about 300 nm. The upper surface of the second interlayer insulation layer 131 is also planarized.

A node contact hole 132 having a diameter of about F and extending through the interlayer insulation layers 131 and 121 reaches the monocrystalline silicon layer 116a and is filled with the contact plug 133 consisted of $N^+$ type polycrystalline silicon layer, for example.

The storage node electrode 134 provided on the upper surface of the second interlayer insulation layer 131 is consisted of the $N^+$ type polycrystalline silicon layer about 800 nm, for example and is directly connected to the contact plug 133 and thus is connected to the source and drain region 118a. The interval and minimum width of the storage node electrode 134 are F and F+2α, respectively. At least a part of the upper surface and the side surface of the storage node electrode 134 and the upper surface of the interlayer insulation layer 131 are directly covered with the capacitive insulation layer 135 of ONO layer.

The layer thickness of the capacitive insulation layer 135 as converted into the layer thickness of the silicon oxide layer is about 5 nm. The surface of the capacity insulation layer 135 is directly covered with a cell plate electrode 136 of $N^+$ type polycrystalline silicon layer in a thickness of 150 nm, for example. The surface of the plate electrode 136 is directly covered with the surface protective layer 114 consisted of the silicon oxide type insulation layer. The layer thickness of the protective layer 141 immediately above the storage node electrode 134 is about 300 nm.

In the shown first embodiment, the width of the monocrystalline silicon layer 117 at a the portion reaching the node contact hole 132 is about 380 nm (>350 nm (=2F+2α). Therefore, the bottom portion of the node contact hole 132 is formed only by the upper surface of the monocrystalline silicon layer 117a. Thus, the monocrystalline silicon layer 117a also satisfactorily serves as the contact pad for the node contact hole 132. Therefore, the leak current and the shorting between the storage node electrode 134 (also the source and drain region 118a) and the gate electrode 111 can be easily restricted.

Figure 5A:
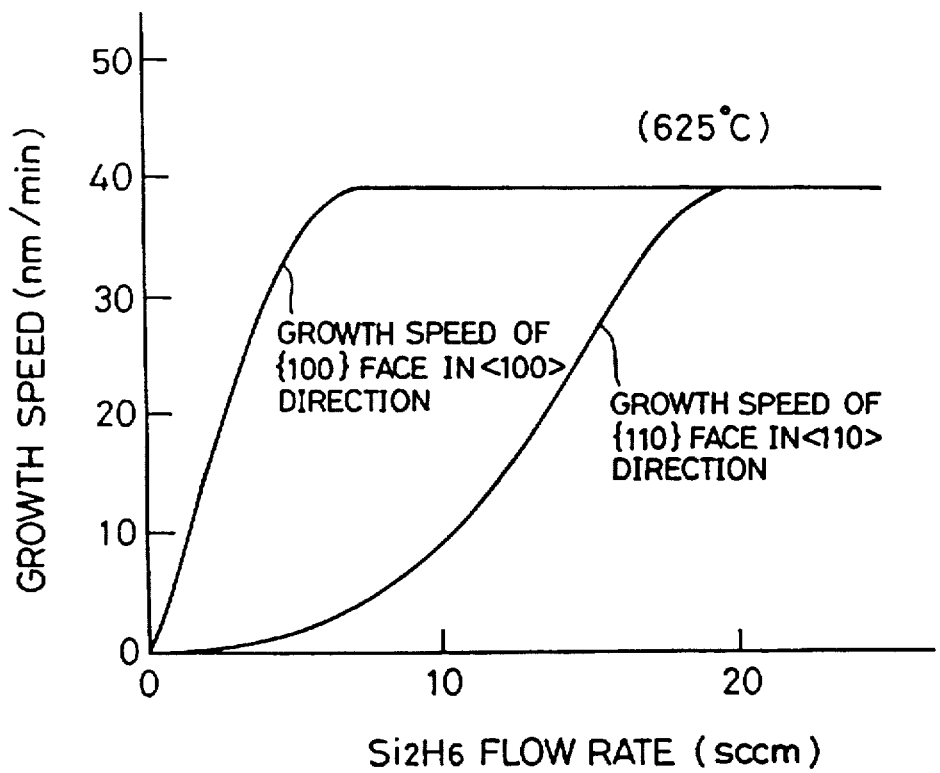
Figure 5B:
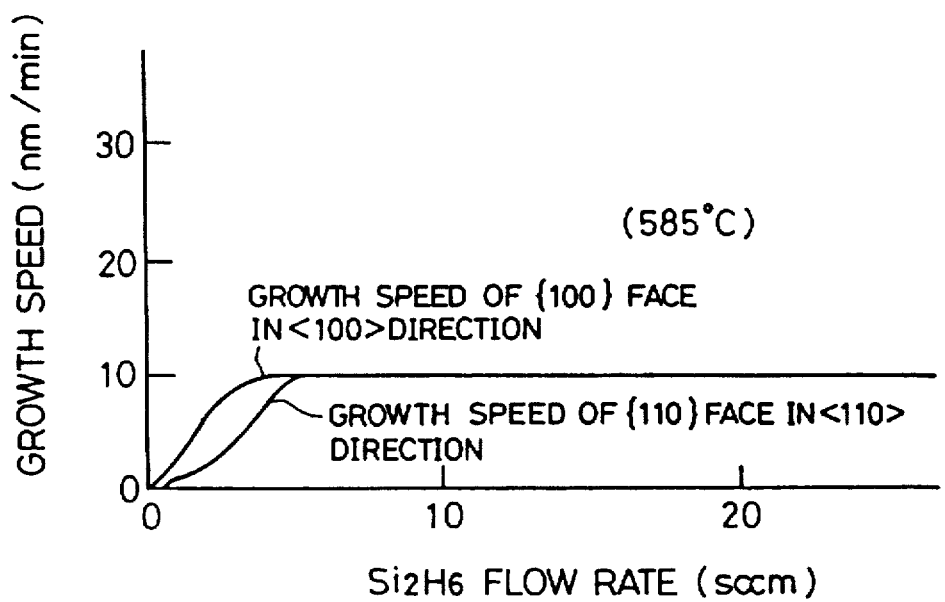

Here, reference is made to FIGS. 3A to 3E and 4A to 4E respectively showing diagrammatic sections showing fabrication process of the first embodiment of the semiconductor device taken along line A—A and C—C, and also FIGS. 5A and 5B showing graphs of growth speed of the monocrystalline silicon layer relative to flow rate of disilane in order to explain anisotropic selective epitaxial growth of the monocrystalline silicon layer, as well as FIGS. 1A to 2C, the shown embodiment of DRAM is fabricated through the following process.

At first, on the major surface of the P-type silicon substrate 101 of silicon wafer having the major surface consisted of {100} face with resistivity of about 50 Ω·cm and having orientation flat consisted of edge of <110> direction, a pad oxide layer (not shown) is formed, and silicon nitride layer (not shown) covering the pad oxide layer is formed.

On the surface of the silicon nitride layer, a photo resist layer (not shown) is formed only in a region covering the immediately above the active region 102 of the major surface of the P-type silicon substrate 101. The active region 102 is defined by the edge of <110> direction (parallel to and perpendicular to the orientation flat) in the major surface of the P-type silicon substrate 101. Respective active regions 102 are in T-shaped form and regularly arranged on the major surface of the P-type silicon substrate 101.

After patterning of the silicon nitride layer, taking the photo resist layer as a mask, ion implantation of boron of $5 \times 10^{12}$ $cm^{-3}$ at 50 keV, taking the photo resist layer as the mask. After removing the photo resist layer, known selective oxidation is performed.

By this, a LOCOS type field oxide layer 105 in a thickness of 300 nm and a $P^-$ type diffusion layer 104 directly connected to the bottom of the field oxide layer 105 are formed. After removal of the silicon nitride layer and the pad oxide layer, a gate oxide layer 106 in a thickness of 8.5 nm is formed on the surface of the active region 102 by thermal oxidation.

Next, by CVD method at about 700° C. employing dichlorsilane and hydrogen phosphide as material gas and doping gas, $N^+$ polycrystalline silicon layer (not clearly shown in the drawing) in a thickness of layer thickness of 50 nm is formed over the entire surface. Furthermore, by way of sputtering, tungsten silicide layer (not clearly shown) in a thickness of 100 nm is formed over the entire surface. Furthermore, by CVD method, a silicon oxide layer is formed with a thickness of 100 nm over the entire surface.

The silicon oxide layer, tungsten silicide layer and $N^+$ type polycrystalline silicon layer are patterned sequentially by anisotropic etching. The gate electrode 111 is formed having a thickness of about 150 nm consists of a tungsten polycide (stacked layer of $N^+$ type polycrystalline silicon an layer and tungsten silicide layer) and the silicon oxide layer cap 112 (in a thickness of about 100 nm) selectively covers the upper surface of the gate electrode 111.

By ion implantation of phosphorous of $2\times10^{13}$ cm$^{-3}$ at 30 keV, for example, N$^-$ type diffusion layers 113a and 113b are formed on the surface of the active region 102 in self-alignment with the field oxide layer 105 and the gate electrode 111. The junction depth of the N$^-$ type diffusion layers 113a and 113b is about 100 nm. An interval between adjacent N$^-$ type diffusion layers 113a is about 0.35 µm (350 nm) (=F+2α), and an interval between the N$^-$ type diffusion layer 113a and N$^-$ type diffusion layer 113b is about 0.25 µm (250 nm) (=F). A silicon nitride layer of about 50 nm is formed over the entire surface by CVD.

Then, etching back by anisotropic etching employing an etching gas of fluorocarbon type is performed to form the silicon nitride layer spacer 115. During this etching back, the silicon oxide layer cap 112 is also exposed to the etching gas. Therefore, the thickness of the silicon oxide layer cap 112 becomes about 70 nm.

On the other hand, the gate oxide layer 106 on the surface of the N$^-$ type diffusion layers 113a and 113b is removed in self-alignment with the silicon nitride layer spacer 115 and the filed oxide layer 105 to expose the surfaces of the N$^-$ type diffusion layers 113a and 113b in these portions (FIGS. 1A, 1B, 2A to 2C, 3A and 4A).

Next, by employing UHV-CVD device, after a natural oxide layer is formed on the exposed surfaces of the N$^-$ type diffusion layers 113a and 113b, N$^+$ type monocrystalline silicon layers 116a and 116b (as first silicon layer) with a thickness of 400 nm are formed in self-align with the exposed surface of the N$^-$ type diffusion layers 113a and 113b by anisotropic selective epitaxial growth with disilane in a flow rate of 2.0 sccm at a pressure of about $1\times10^{-2}$ Pa and a doping gas (1% of hydrogen phosphide diluted by hydrogen) in a flow rate of 0.2 sccm, at a temperature of 625° C. On the surface of the exposed N$^-$ diffusion layer 113a and 113b, N$^+$ type diffusion layers 115a and 115b having a junction depth of about 70 nm are formed.

Under this condition, the growth speed of {100} face in <100> direction (of monocrystalline silicon layer) is about 10 nm/min. At this, the growth speed of {110} face in <110> direction (of the monocrystalline silicon layer) intersecting with the surface of the silicon oxide layer, such as the field oxide layer 105 is about one twentieth of the growth speed of {100} face in <100> direction. While not illustrated, the growth speed of {110} face of (the monocrystalline silicon layer) in <110> direction intersecting the silicon nitride layer is about one tenth of the growth speed of {100} face in <100> direction (see FIG. 5A).

In the first embodiment, the exposed surface of the N$^-$ type diffusion layers 113a and 113b formed in self-alignment with the field oxide layer 105 and the silicon nitride layer spacer 114 is surrounded by the edge of <110> direction. Therefore, the monocrystalline silicon layers 116a and 116b are selectively grown in <100> direction perpendicular to the major surface of the P-type silicon substrate 101, mainly.

While the silicon nitride layer spacer 114 is employed in place of silicon oxide layer in the shown first embodiment, on the side directly intersecting in the vicinity of the upper end portion on the silicon nitride layer spacer 114 on the side surface of the monocrystalline silicon layers 116a and 116b, occurrence of facet on the upper surface of the monocrystalline silicon layers 116a and 116b intersecting with these side surfaces can be reduced (FIGS. 1A and 1B, 2A and 2B, 3B and 4B).

Anisotropic selective epitaxial growth method of the first monocrystalline silicon is preferably performed at a growth temperature in a range of 500° C. to 800° C. at a pressure in a range of $10^{-3}$ Pa to $5\times10^{-2}$ Pa. When the growth temperature is lower than 500° C., monocrystalline silicon cannot be obtained. On the other hand, when the growth temperature is higher than 800° C., doping of conductive impurity of phosphorous or the like becomes difficult. Also, when the pressure is out of the foregoing range, "anisotropic" growth becomes difficult. A tendency of "anisotropic" selectivity becomes higher according to rising of the growth temperature and decreasing of flow rate of disilane.

While anisotropic selective epitaxial growth of monocrystalline silicon layer is possible by employing mono silane (SiH$_4$) in place of disilane as material gas, the growth temperature should be shifted toward the higher temperature side in the extent of 80° C. to 100° C. than the case where disilane is used.

Also, anisotropic selective epitaxial growth of the monocrystalline silicon layer can be done even with dichlorsilane as a material gas. However, in such case, a problem of facets occuring frequently can arise.

Next, after forming of the monocrystalline silicon layers 116a and 116b, N$^+$ type monocrystalline silicon layers 117a and 117b (as second silicon layers) in a thickness of about 100 nm are formed on the surface of the monocrystalline silicon layers 116a and 116b by isotropic selective epitaxial growth (see FIG. 5E) with disilane in a flow rate of about 4.0 sccm and a doping gas (1% of hydrogen phosphide diluted by hydrogen) in a flow rate of 0.4 sccm, at a temperature of 585° C. and at a pressure of about $2\times10^{-2}$ Pa employing the foregoing UHV-CVD device. In this growth condition, the growth speed of the monocrystalline silicon 117a and so forth is equal to the growth speed of the monocrystalline silicon layer 116a and so forth (FIGS. 1A, 1B, 2A to 2C, 3C and 4C).

In the shown first embodiment, instead of forming the (monocrystalline) silicon layer serving as the contact pad and directly connected to the exposed surface of the N$^-$ type diffusion layers 113a and 113b in self-aligned manner by only anisotropic selective epitaxial growth, the monocrystalline silicon layer is formed by performing isotropic selective epitaxial growth after anisotropic selective epitaxial growth. Therefore, the silicon layer has a sufficient height but not the problems of the prior art process and can be easily formed.

It should be noted that while the shown first embodiment sets the growth temperature of the monocrystalline silicon layer 117a and so forth at lower temperature than the growth temperature of the monocrystalline silicon layer 116a and so forth, the shown relationship of the growth temperatures of the monocrystalline silicon layers is not essential.

As can be clear from FIG. 5A, isotropic selective epitaxial growth can be performed by setting the flow rates of the disilane and doping gas respective to 20 sccm and 2 sccm at the growth temperature of 625° C. At this time, since the growth speed becomes high, i.e. 40 nm/min, it is preferred to take a measure, such as to perform growth intermittently under the condition set forth above, for certain control of the layer thickness of the second monocrystalline silicon layer.

It should be appreciated that the second silicon layers to be formed on the surfaces of the monocrystalline silicon layers 116a and 116b are not specified to the monocrystalline silicon layer as in the shown embodiment. It is similarly possible to electively grow N$^+$ type polycrystalline silicon layers in place of the monocrystalline silicon layers 117a and 117b.

Subsequently, formation of the silicon oxide layer, formation of BPSG layer, reflow of the BPSG layer, CMP and so forth are performed to form the first interlayer insulation layer 121 of silicon oxide type insulation layer having a plane upper surface. Then, the bit contact holes 122 extending through the interlayer insulation, layer 121 and reaching the upper surface of the monocrystalline silicon layer 117b are formed. The diameter of these bit contact holes is about 0.25 µm (=F). Even when mis-alignment magnitude in the photolithographic process is significant, the bottom of the bit contact holes 122 may not offset out of the upper surface of the monocrystalline silicon layer 117b (FIGS. 1A, 1B, 2A to 2C, 3D and 4D).

Next, the bit contact holes 122 are filled by contact plugs 123 of conductive layer, such as $N^+$ type polycrystalline silicon layer and so forth. For example, the conductive layer, such as tungsten silicide layer in a layer thickness of 120 nm, is formed by sputtering, for example. Then, the conductive layer is patterned to form the bit lines 124.

Subsequently, a second interlayer insulation layer 131 consisted of silicon oxide type insulation layer, having a flat upper surface is formed. Through the interlayer insulation layers 131 and 121, node contact holes 132 reaching the upper surface of the monocrystalline silicon layer 117a are formed. The diameter of these node contact holes 132 are also about 0.25 µm (=F). Therefore, even when mis-alignment magnitude in the photolithographic process is significant, the bottom of the node contact holes 132 may not offset out of the upper surface of the monocrystalline silicon layer 117a (FIGS. 1A, 1B, 2A to 2C, 3E and 4E).

Next, by the contact plugs 133 of conductive layers, such as $N^+$ type polycrystalline silicon layer and so forth, the node contact holes 132 are filled. Then, over the entire surface, an $N^+$ type polycrystalline silicon layer in a thickness of 800 nm is formed and patterned to form storage node electrodes 134.

It should be noted that the storage node electrodes 134 and the contact plugs 133 may be formed with the same $N^+$ type polycrystalline silicon layer and through the same patterning process. Then, the capacitive insulation layer 135, such as ONO layer, is formed, and thereafter, cell plate electrodes 136 of $N^+$ type polycrystalline silicon having layer thickness of 150 nm, are formed. Also, the surface protective layer 141 is formed to complete the first embodiment of DRAM (FIGS. 1A, 1B and 2A to 2C).

Next, the second embodiment of the semiconductor device and fabrication process thereof according to the present invention will be discussed.

Referring to FIGS. 6A, 6B and 7A to 7C which are respectively diagrammatic plan view and diagrammatic sections of DRAM, to which the second embodiment of a semiconductor device according to the present invention, is applied. The DRAM (of normal stack structure, in which the bit line is located at higher position than capacitor)is fabricated based on 0.25 µm design rule. The second embodiment of the semiconductor device is differentiated from the first embodiment in the height relationship of the bit line and the capacitor and structure of the isolating region. The shown DRAM implementing the second embodiment of the semiconductor device according to the present invention will be discussed hereinafter.

Figure 6A:
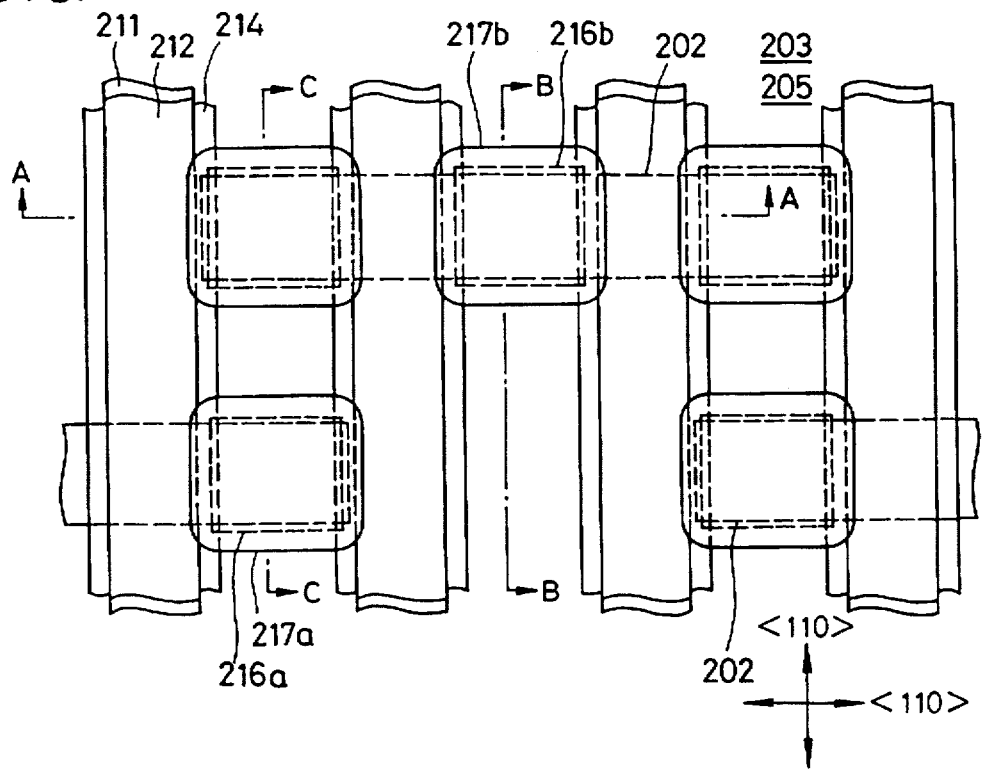
FIGS. 6A and 6B are plan views of the second embodiment of the semiconductor device according to the present invention.
Figure 6B:
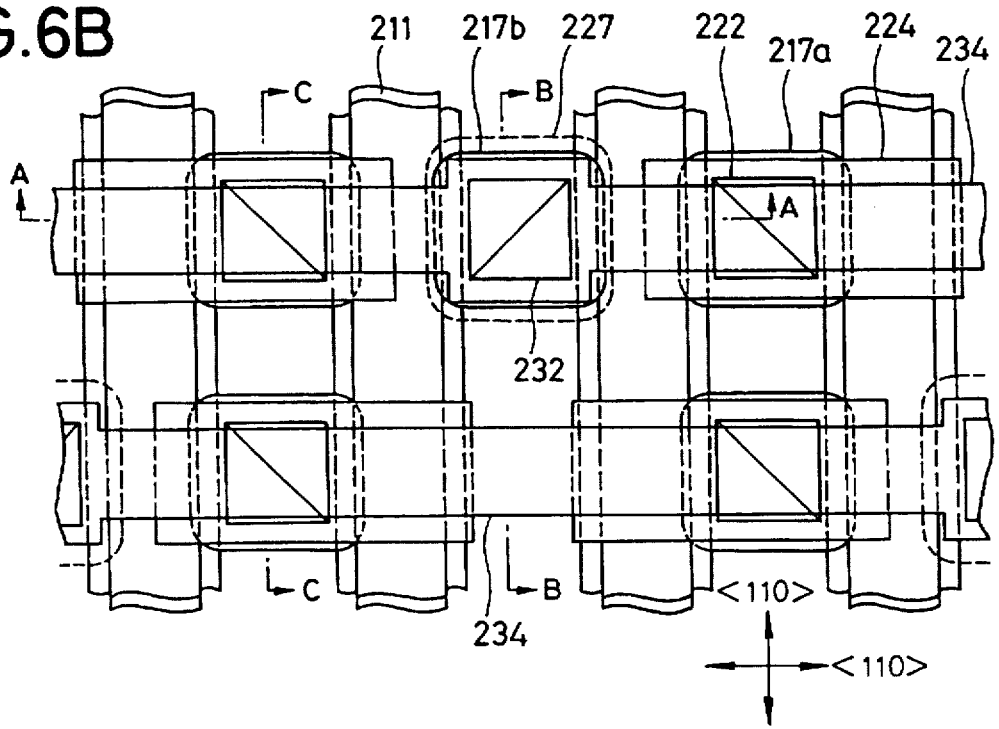
Figure 7A:
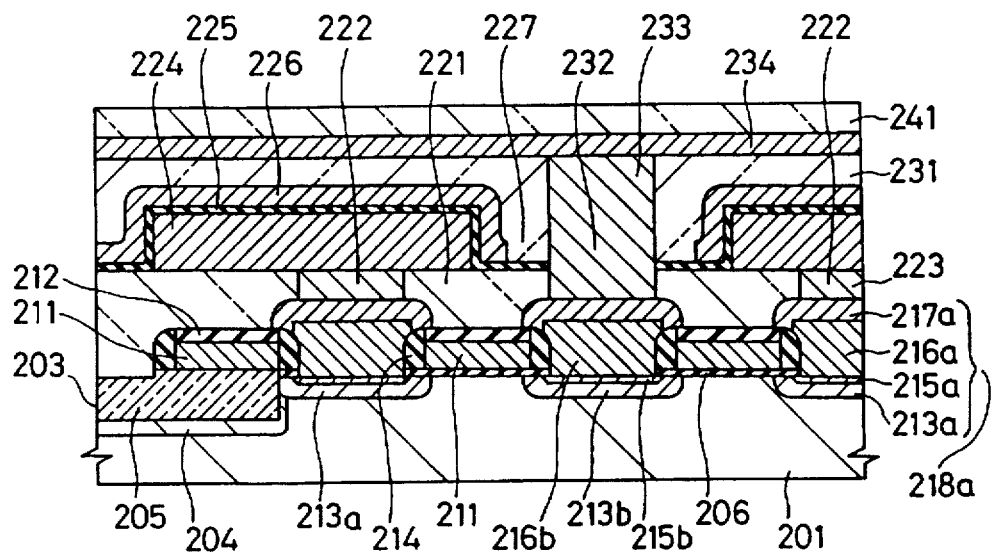
FIGS. 7A to 7C are diagrammatic sections of the second embodiment of the semiconductor device, respectively taken along lines A—A, B—B and C—C of FIGS. 6A and 6B.
Figure 7B:
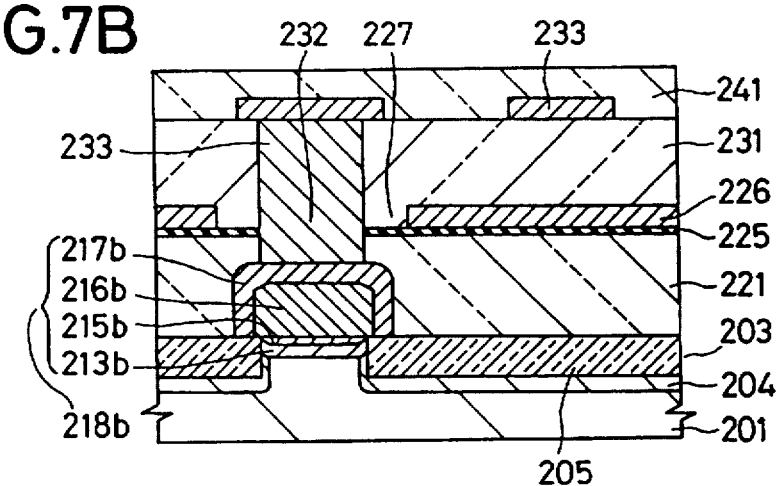
Figure 7C:
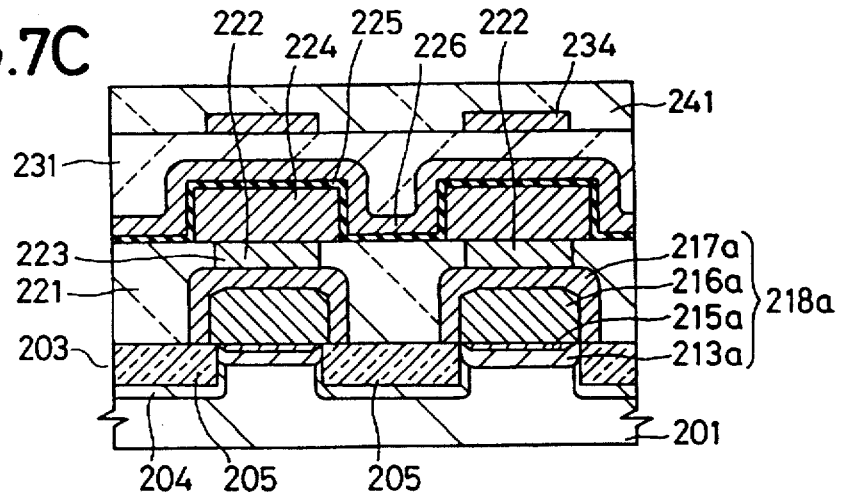
Figure 8A:
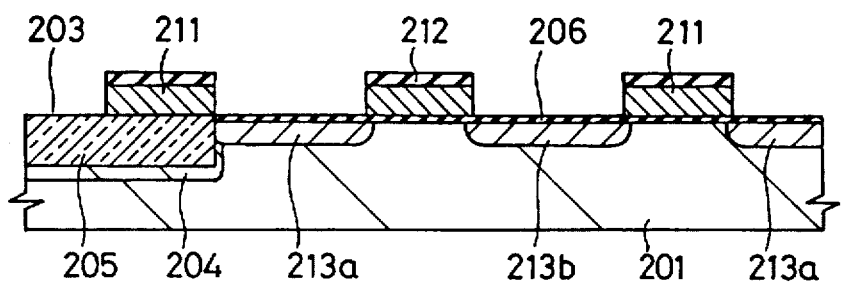
FIGS. 8A to 8D are diagrammatic sections of fabrication process of the second embodiment of the semiconductor device according to the present invention, taken along line A—A of FIGS. 6A and 6B.
Figure 8B:
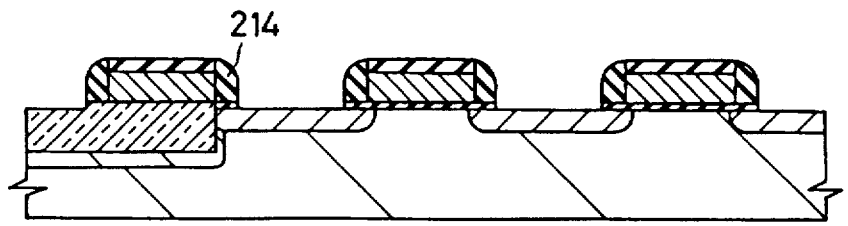
Figure 8C:
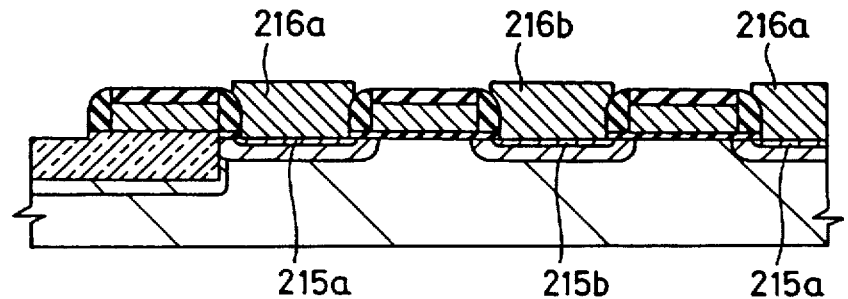
Figure 8D:
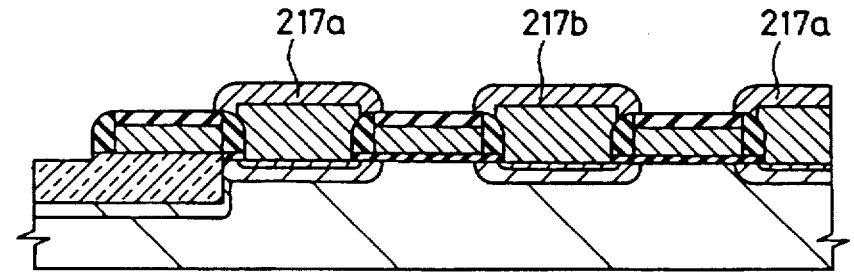
Figure 9A:
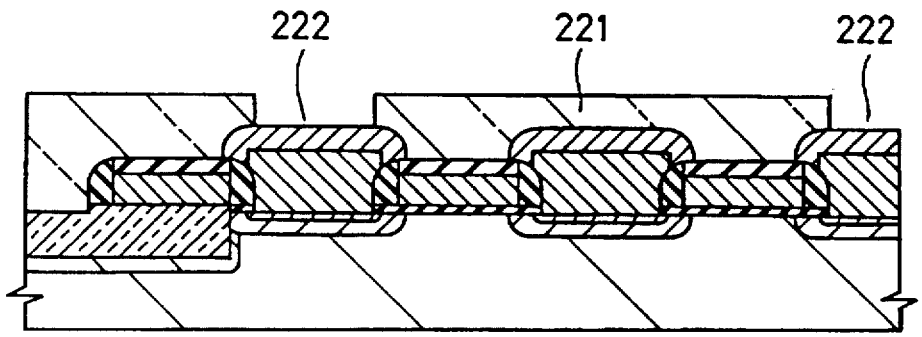
FIGS. 9A to 9C are diagrammatic sections of fabrication process of the second embodiment of the semiconductor device according to the present invention, taken along line A—A of FIGS. 6A and 6B.
Figure 9B:
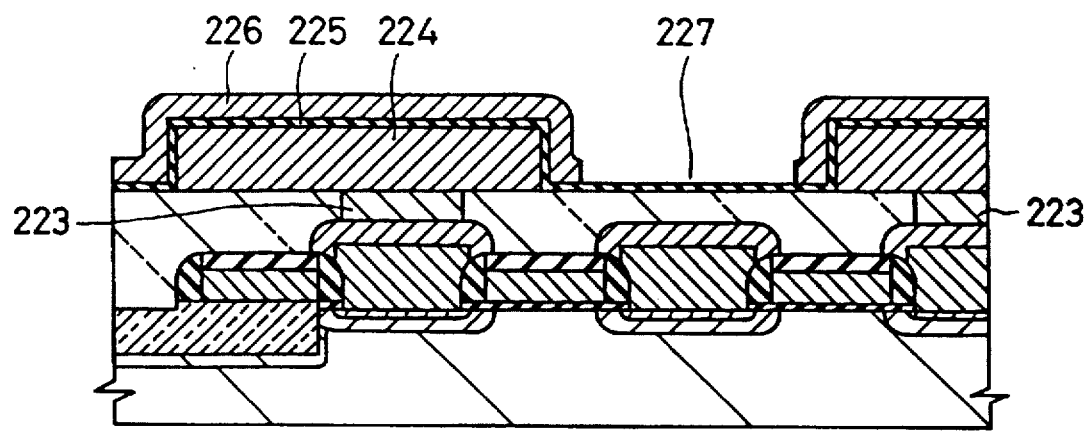
Figure 9C:
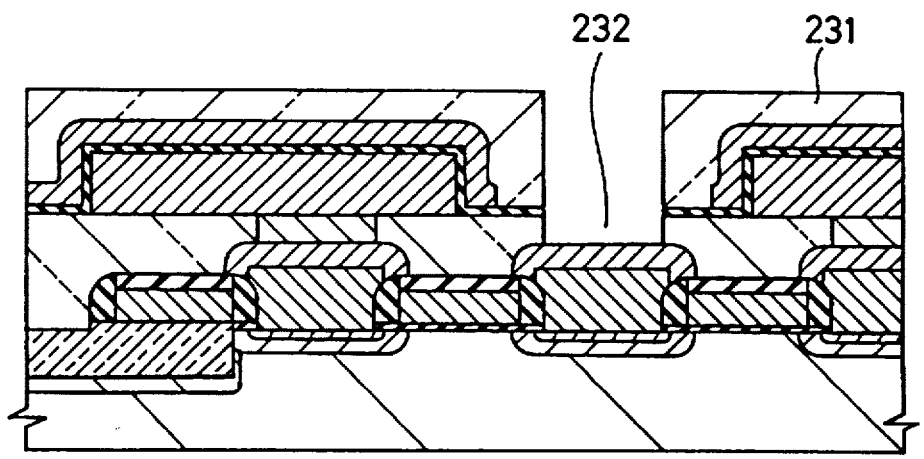
Figure 10A:
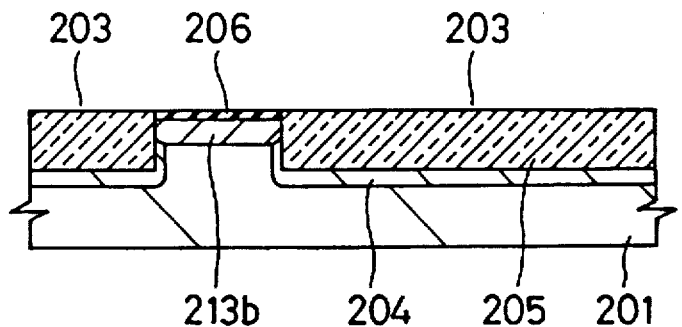
FIGS. 10A to 10D are diagrammatic sections of fabrication process of the second embodiment of the semiconductor device according to the present invention, taken along line B—B of FIGS. 6A and 6B.
Figure 10B:
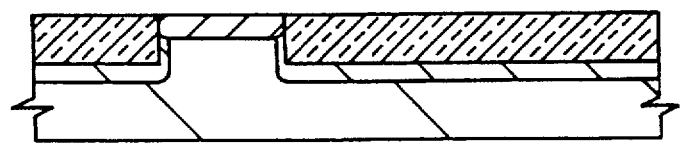
Figure 10C:
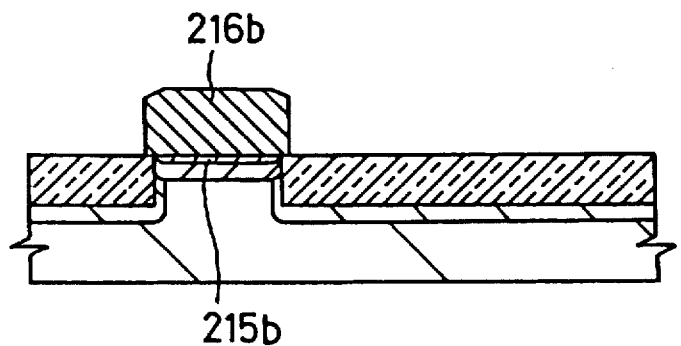
Figure 10D:
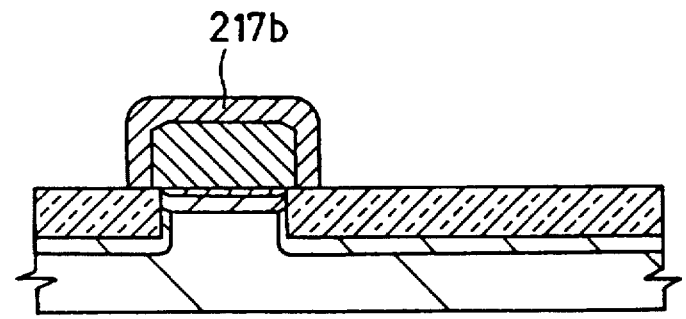
Figure 11A:
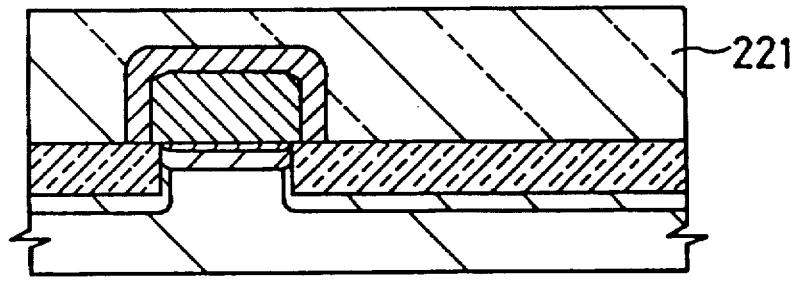
FIGS. 11A to 11C are diagrammatic sections of fabrication process of the second embodiment of the semiconductor device according to the present invention, taken along line B—B of FIGS. 6A and 6B.
Figure 11B:
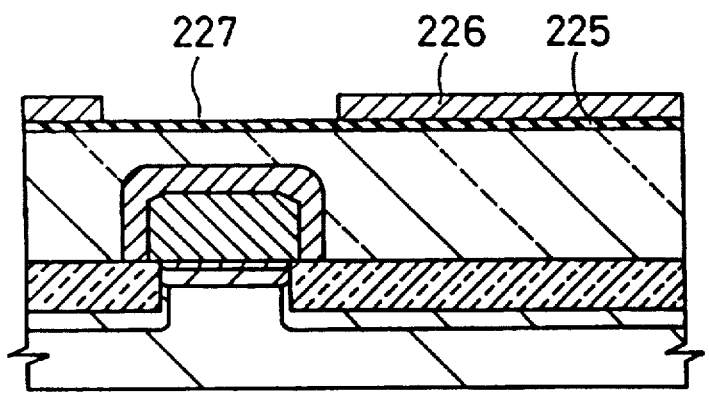
Figure 11C:
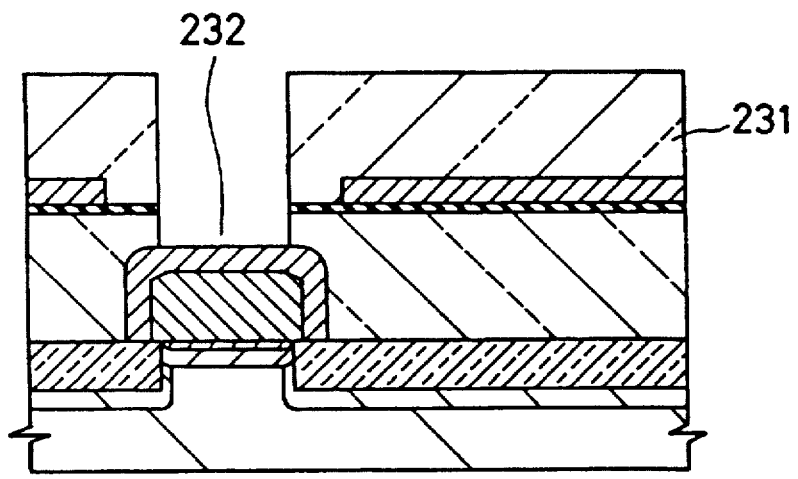
Figure 12A:
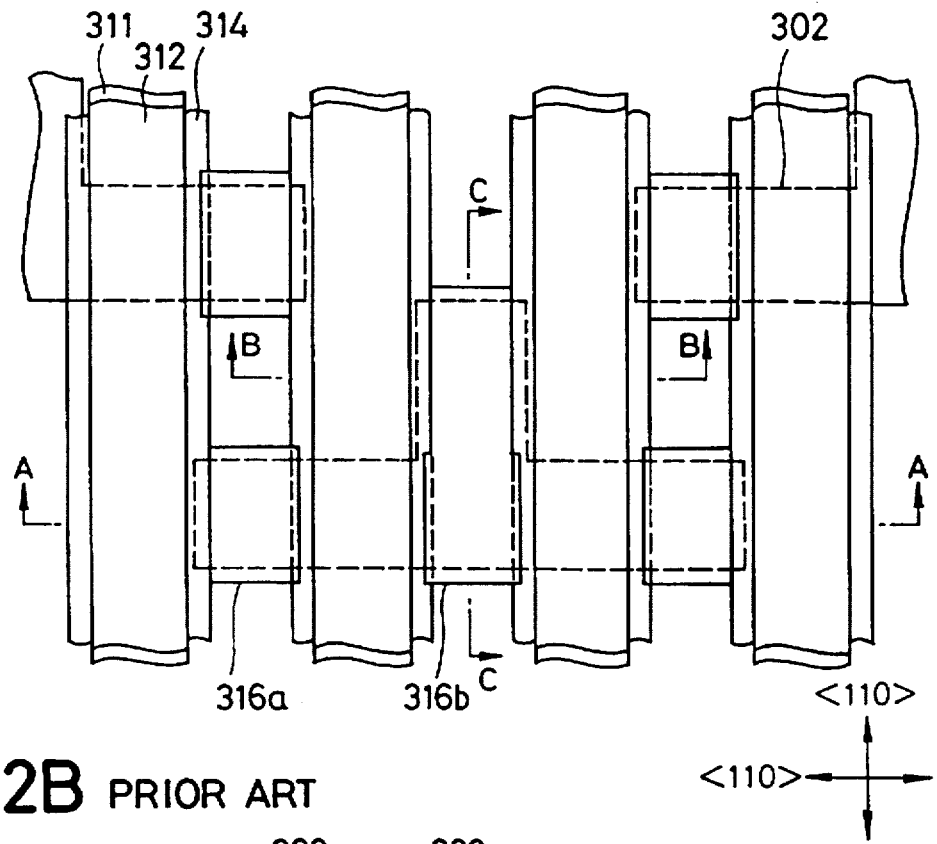
FIG. 12 is a diagrammatic plan view for explaining the prior art.
Figure 12B:
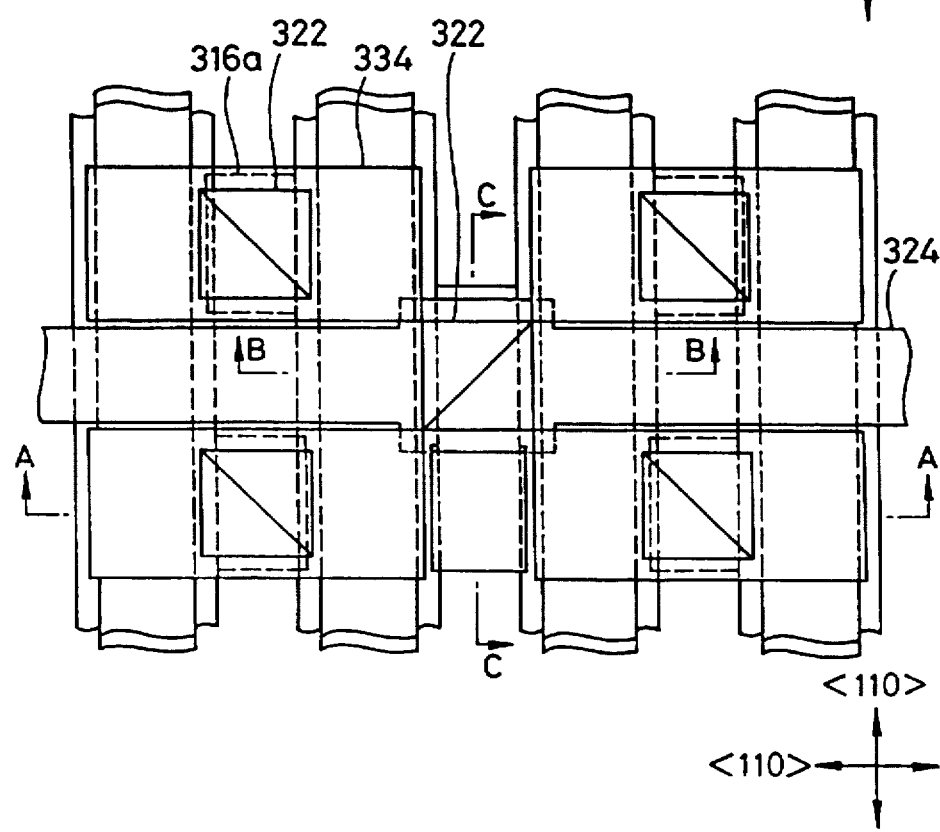
Figure 13A:
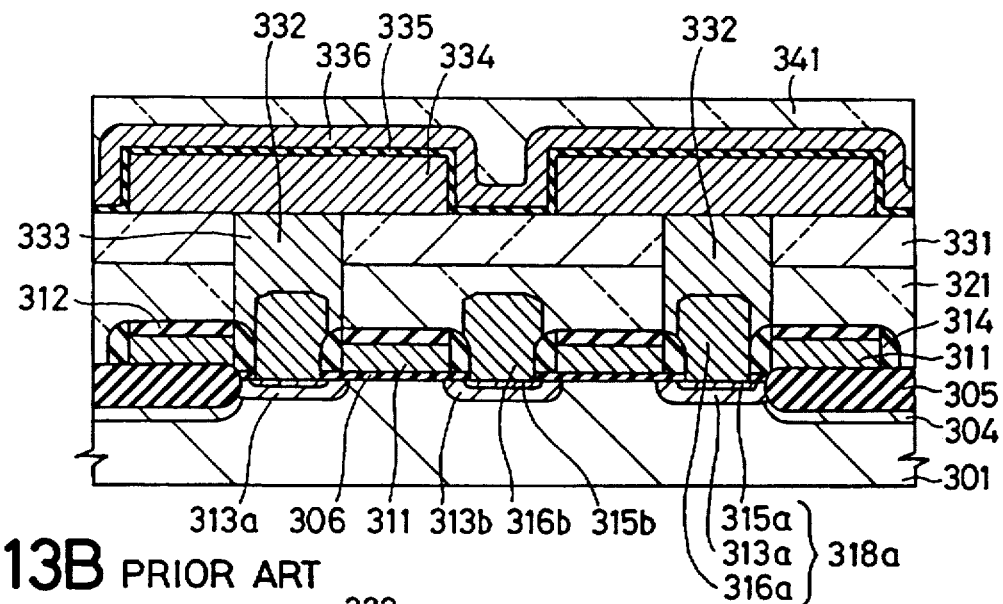
FIGS. 13A to 13C are diagrammatic section for explaining the prior art, taken along lines A—A, B—B and C—C of FIGS. 6A and 6B.
Figure 13B:
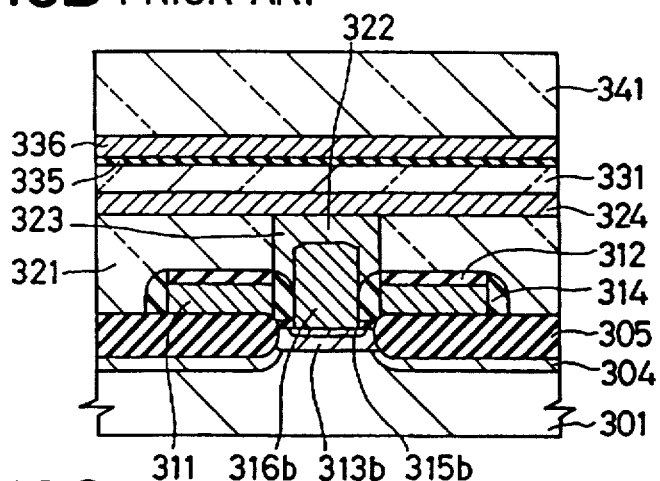
Figure 13C:
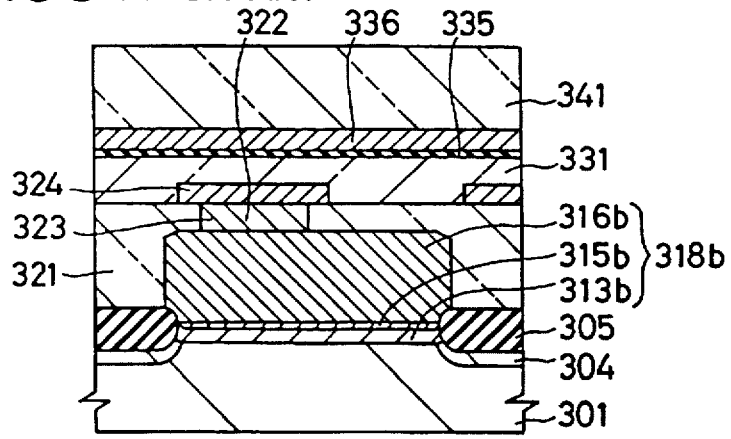
Figure 14:
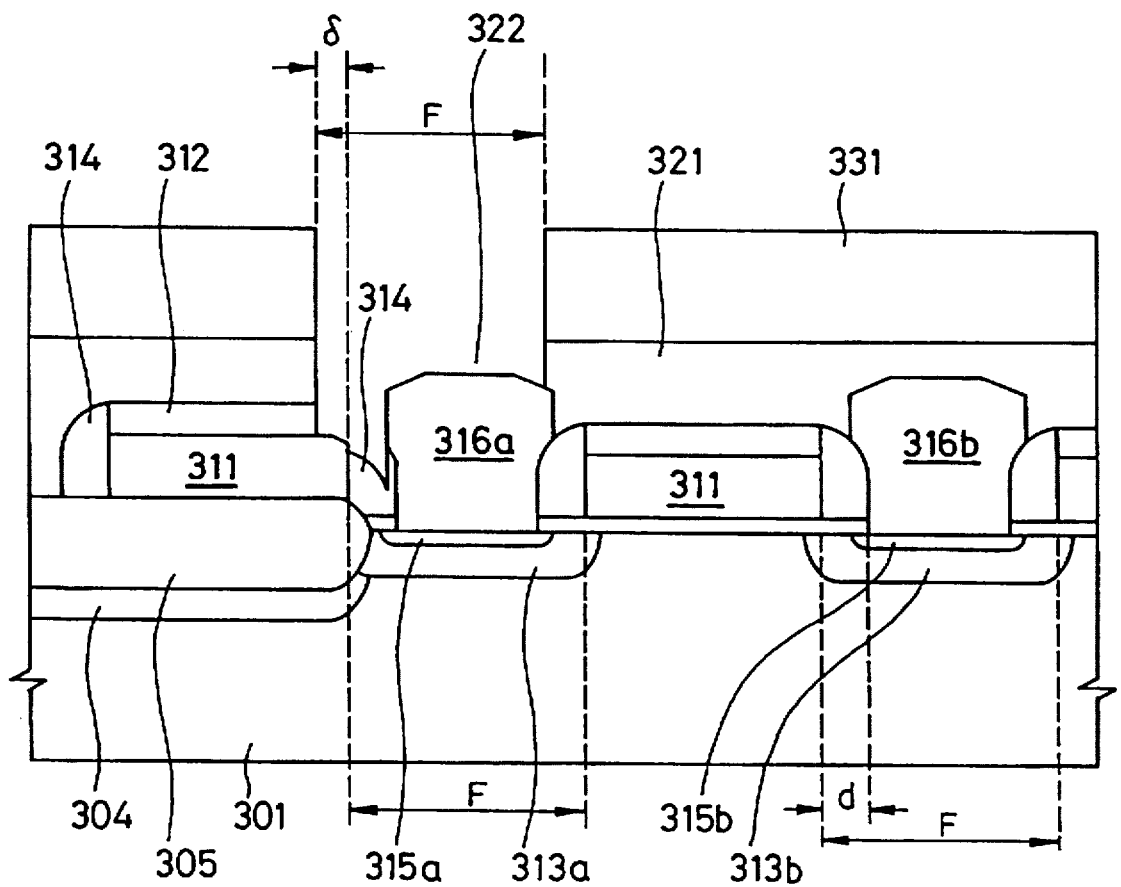
FIG. 14 is a diagrammatic illustration for explaining problem in the prior art.

FIGS. 6A and 6B are diagrammatic plan view at different levels, in which FIG. 6A illustrates positional relationship between an active region and a second silicon layer consisted of gate electrodes also serving as word lines and an $N^+$ type monocrystalline silicon, and FIG. 6B illustrates positional relationship between the gate electrodes and the second silicon layer, storage node electrodes, and bit lines. On the other hand, FIGS. 7A, 7B and 7C are diagrammatic sections taken along lines A—A, B—B and C—C of FIG. 6. It should be noted that, in FIGS. 6A and 6B, gate electrode and bit line are illustrated thinner than actual width for facilitating understanding of the positional relationship.

The major surface of P-type silicon substrate 201 is {100} face. A registivity of the P-type silicon substrate is about 5 Ω·cm. An orientation flat of the silicon wafer forming the P-type silicon substrate 201 is an edge of <110> direction.

An active region 202 on the surface of the P-type silicon substrate 201 is surrounded by an isolation region. The isolation region is formed from a groove 203 in a depth of about 300 nm, a $P^-$ type diffusion layer 204 (serving as a channel stopper and punch through stopper) formed on the side surface and the bottom surface of the groove 203, and a field insulation layer 205 filling the groove 203 and consisting of silicon oxide layer having flat surface.

These active regions 202 are regularly arranged on the major plane of the P-type silicon substrate 201. Peripheral edge of the active region is in the <110> direction. In other words, the active region 202 is defined by the edge of <110> direction. The minimum width (≈channel width) and minimum interval of the active region 202 are respectively about F (=250 nm)) and about F+2α (=350 nm). A gate electrode 211 also serving as a word line, in a layer thickness of 150 nm, extends across the active region 202 via the gate oxide layer 206 having a layer thickness of about 8.5 nm and provided on the surface of the active region 202.

At least in a region immediately above the active region 202, these gate electrodes 211 extend perpendicular to the active region 202. The width (gate length), interval and wiring pitch of the gate electrodes 211 are respectively about F, F+2α and 2F+2α (=600 nm). The gate electrode 211 is formed by stacking a tungsten silicide layer in a thickness of about 100 nm over an $N^+$ type polycrystalline silicon layer in a thickness of about 50 nm.

The upper surface of the gate electrode 211 is directly covered with a oxide silicon layer cap 212 in a thickness of about 70 nm. On the surface of the active region 202, $N^-$ type diffusion layers 213a and, 213b respective having about 100 nm of junction depth, in self-alignment with the gate electrodes 211 and the field oxide layer 205. The side surfaces of the gate electrode 211 and the oxide silicon layer cap 212 are directly covered with an oxide silicon layer spacer 214 in a thickness of about 50 nm (=d (=α)).

The gate oxide layer 206 provided on the surface of the active region 202 is removed in self-align manner with respect to the field oxide layer 205 and the silicon nitride layer spacer 214 thereof to expose the surface of the $N^-$ type diffusion layers 213a and 213b. A width of the exposed surface in an alignment direction of two gate electrodes 211 is about F. The width of the exposed surface in the portion disposed between the field oxide layers 205 is about F. The height of the upper surface of the silicon oxide layer cap 212 from the major surface of the P-type silicon substrate 201 is about 230 nm.

The exposed surface of the $N^-$ type diffusion layers 213a and 213b are directly covered with $N^+$ type monocrystalline silicon layers 216a and 216b (as first silicon layer) having a height (layer thickness) of about 300 nm and containing impurity concentration of about $1 \times 10^{19}$ cm$^{-3}$. It is desirable that the height (layer thickness) of these monocrystalline silicon layers 216a and 216b is not lower (thinner) than at least that (about 230 nm) of the oxide silicon layer cap 212.

On the exposed surface of the N⁻ type diffusion layers 213a and 213b, N⁺ type diffusion layers 215a and 215b having a (junction) depth about 70 nm are provided. These N⁺ type diffusion layers 215a and 215b are formed by solid phase diffusion of phosphorous from respective monocrystalline silicon layers 216a and 216b. The monocrystalline silicon layers 216a and 216b extend in a width (having a form directly covering the upper surface of the field insulation layer 205) about 15 nm on the upper surface of the field insulation layer 215, and extend in a width (having a form directly covering the upper end portion of the silicon nitride layer cap 214) greater than 10 nm in the vicinity of the upper end of the silicon nitride layer cap 214.

The upper surfaces of the monocrystalline silicon layers 216a and 216b have a {100} face parallel to the major surface of the P-type silicon substrate 201. The side surfaces of monocrystalline silicon layers 216a and 216b have a {110} face perpendicular to the major plane of the P-type silicon substrate 201.

In the shown second embodiment, a facet forming the upper surface in the vicinity of the intersection of the side surface and the upper surface of the monocrystalline silicon layers 216a and 216b is present only in the vicinity of the intersection of the side surface on the side of the field oxide layer 205, in general.

The upper surface and the side surface of the monocrystalline silicon layers 216a and 216b are directly covered with N⁺ type monocrystalline silicon layers 217a and 217b (as second silicon layers) in the layer thickness of 100 nm, for example. The monocrystalline layers 217a and 217b extend in width about 50 nm on the upper surface of the field oxide layer 205 (in the width about 65 nm as added monocrystalline silicon layer 216a) (in a form directly covering the upper surface of the field oxide layer 205) to cover the portion in the vicinity of the upper end of the silicon nitride layer cap 214 and extend in a width greater than 10 nm on the upper surface of the silicon oxide layer cap 212 (in a form directly covering the upper surface of the silicon oxide layer cap 212). An interval of adjacent two monocrystalline silicon layers 217a is about 280 nm, and the interval between the monocrystalline silicon layer 217a and the monocrystalline silicon layer 217b is about 230 nm.

It should be noted that, in the shown second embodiment, the second silicon layer is not limited to the foregoing N⁺ type monocrystalline silicon layers 217a and 217b but may be constructed with N⁺ type polycrystalline silicon formed by selective growth.

In the second embodiment, a source and drain region 218a is constructed with an N⁻ type diffusion layer 213a, an N⁺ type diffusion layer 215a, the monocrystalline silicon layer 216a and the monocrystalline silicon layer 217a. A source and drain region 218b is constructed with an N⁻ type diffusion layer 213b, an N⁺ type diffusion layer 215b, the monocrystalline silicon layer 216b and the monocrystalline silicon layer 217b.

An N-channel MOS transistor formed on the major surface of the P-type silicon substrate 201 is constructed with a gate oxide layer 206, a gate electrode 211 and the source and drain regions 218a and 218b. An interval of adjacent monocrystalline silicon layers 217a and an interval between the monocrystalline silicon layers 217a and 217b are respectively about 280 nm and 230 nm. Sufficient interval between adjacent source and drain regions 218a and interval between the source and drain region 218a and the source and drain region 218b for insulation can be provided.

The P-type silicon substrate 201 including an N-channel MOS transistor is covered with a first interlayer insulation layer 221. The first interlayer insulation layer 221 is constituted of a silicon oxide type insulation layer, such as a stacked layer of silicon oxide layer and BPSG layer formed by CVD method, for example, and has an upper surface planarized by chemical mechanical polishing (CMP) or so forth. The layer thickness of the interlayer insulation layer 221 on the upper surface of the monocrystalline silicon layers 217a and 217b is about 300 nm, for example. In the interlayer insulation layer 221, node contact holes 222 having a diameter of about F are provided to reach the monocrystalline silicon layer 217a. These node contact holes 222 are filled with a contact plug 223 of N⁺ type polycrystalline silicon layer, for example.

The storage node electrodes 224 provided on the upper surface of the interlayer insulation layer 221 consist of a N⁺ type polycrystalline silicon layer with a layer thickness of about 800 nm and are directly connected to the contact plug 223, and connected to the source and drain region 218a. The minimum width and minimum interval of the bit line 224 are respectively about F and F+2α. At least a part of the upper and side surfaces of the storage node electrodes 224 and the upper surface of the interlayer insulation layer 221 are directly covered with a capacitive insulation layer 225 consisting of ONO layer.

The layer thickness of the capacitive insulation layer 225 as converted into the layer thickness of the silicon oxide layer is about 5 nm. The surface of the capacity insulation layer 225 is directly covered with a cell plate electrode 226 of N⁺ type polycrystalline silicon layer in a thickness of 150 nm, for example.

In the shown second embodiment, the width of the monocrystalline silicon layer 217a at a the portion reaching the node contact hole 222 is about 370 nm (>350 nm (=2F+2α). Therefore, the bottom portion of the node contact hole 222 is formed only by the upper surface of the monocrystalline silicon layer 217a. Thus, the monocrystalline silicon layer 217a also satisfactorily serve as the contact pad for the node contact hole 222.

Therefore, similarly to the foregoing first embodiment, the leak current and the shorting between the storage node electrode 224 (also the source and drain region 218a) and the gate electrode 211 can be easily restricted.

Through the cell plate electrode 226 immediately above the monocrystalline silicon layer 217b, an opening 227 having a diameter of about 400 nm is provided. The first interlayer insulation layer 221 including the cell plate electrode 226 is covered with a second interlayer insulation layer 231. The second interlayer insulation layer 231 is also formed by the silicon oxide type insulation layer. The layer thickness of the interlayer insulation layer 231 on the upper surface of the cell plate electrode 226 in a portion covering the storage node electrode 224 is about 300 nm. The upper surface of the interlayer insulation layer 231 is planarized.

Bit contact holes 232 having diameter of about F are formed through the interlayer insulation layer 231, the capacitive insulation layer 225 and the interlayer insulation layer 221 to reach the monocrystalline silicon layer 216a. The bit contact holes 232 are filled with contact plugs 233 consisting of a N⁺ type polycrystalline silicon layer, for example.

Bit lines 234 provided on the upper surface of the interlayer insulation layer 231 are directly connected to the contact plugs 233 and thus connected to the source and drain region 218b. These bit lines 234 consisted of a tungsten silicide layer in a thickness of about 120 nm. The minimum width and minimum interval of the bit lines 234 are respectively about F. The width of the bit line 234 at the portion of the bit contact hole 232 is about 350 nm (=F+2α), and the wiring pitch of the bit lines 234 is about 600 nm (=2F+2α).

The surface of the bit lines 234 are directly covered with a surface protective layer 241 of silicon oxide type insulation layer. The layer thickness of the surface protective layer 241 immediately above the bit line is about 300 nm.

In the shown second embodiment, the width of the monocrystalline silicon layer 217b at a the portion reaching the bit contact hole 232 is about 370 nm (>350 nm (=2F+2α). Therefore, the bottom portion of the bit contact hole 232 is formed only by the upper surface of the monocrystalline silicon layer 217b. Thus, the monocrystalline silicon layer 217b also satisfactorily serve as the contact pad for the bit contact hole 232.

Namely, the bottom of the bit contact hole 232 does not directly reach the silicon oxide layer cap 212 or the silicon nitride layer spacer 214, and the upper surface of the gate electrode 211 is prevented from exposing in the bottom of the bit contact hole 232. Therefore, similarly to the foregoing first embodiment, the leak current and the shorting between the storage node electrode 234 (also the source and drain region 218b) and the gate electrodes 211 can be easily restricted.

Here, reference is made to FIGS. 8A to 8D and 9A to 9C respectively showing diagrammatic sections showing fabrication process of the second embodiment of the semiconductor device taken along line A—A, and also FIGS. 10A to 11C showing graphs of growth speed of the monocrystalline silicon layer relative to flow rate of disilane in order to explain anisotropic selective epitaxial growth of the monocrystalline silicon layer, as well as FIGS. 6A to 7C, the shown embodiment of DRAM is fabricated through the following process.

At first, on the major surface of the P-type silicon substrate 201 of silicon wafer having the major surface consisting of a {100} face with registivity of about 50 Ω·cm and having orientation flat consisted of edge of <110> direction, a photo resist layer (not shown) is formed, in the regions covering only the active regions 202 on the major surface of the P-type silicon substrate 201.

The active regions 202 are defined by the edge of <110> direction (parallel to and perpendicular to the orientation flat) of the major surface of the P-type silicon substrate 201, and respectively in rectangular shaped configuration. Respective active regions 202 are regularly arranged on the major surface of the P-type silicon substrate 201. Using the photo resist layer as a mask, the P-type silicon substrate is etched to form the groove 203.

Thereafter, taking the photo resist layer as a mask, ion implantation of boron of $5\times10^{12}$ cm$^{-3}$ at 20 keV is performed to form a P$^-$ type diffusion layer 204 on the side surface and bottom surface of the groove 203. After removing the photo resist layer, silicon oxide layer is formed over the entire surface by CVD method. By CMP, the silicon oxide layer is removed with filing the groove 203 to form the field insulation layer 205 having flat upper surface. On the surface of the active region 202, the gate oxide layer 206 with a thickness of about 8.5 nm is formed by thermal oxidation.

Next, N$^+$ type polycrystalline silicon layer (not shown) with a thickness of about 50 nm is formed over the entire surface. Also, a tungsten suicide layer (not clearly shown) with a thickness of 100 nm is formed over the entire surface. Also, by way of CVD method, the silicon oxide layer with a thickness of 100 nm is formed over the entire surface. The silicon oxide layer, the tungsten silicide layer and the N$^+$ type polycrystalline silicon layer are sequentially patterned by anisotropic etching. The silicon oxide layer cap 212 (in a thickness of about 100 nm) selectively covering the gate electrode in a thickness of about 150 nm consisted of tungsten polycide layer and the upper surface of the gate electrode 211, is formed.

The N$^-$ type diffusion layers 213a and 213b are formed on the surface of the active region 202 in self-alignment with the field insulation layer 205 and the gate electrode 211. The junction depth of the N$^-$ type diffusion layers 213a and 213b is about 100 nm. An interval between adjacent N$^-$ type diffusion layers 213a is about F+2α, and an interval between the N$^-$ type diffusion layer 213a and N$^-$ type diffusion layer 213b is about F (FIGS. 6A, 6B, 7A to 7C, 8A and 10A).

Then, the silicon nitride layer with a thickness of about 50 nm is formed over the entire surface by CVD. Then, the silicon nitride layer is etched back by anisotropic etching to form the silicon nitride layer spacer 215. In etching back, the silicon oxide layer cap 212 is exposed by etching. The layer thickness of the silicon oxide layer cap 212 is about 70 nm.

On the other hand, the gate oxide layer 206 on the surface of the N$^-$ type diffusion layers 213a and 213b is removed in self-alignment with the silicon nitride layer spacer 215 and the filed oxide layer 205 to expose the surfaces of the N$^-$ type diffusion layers 213a and 213b in these portions (simultaneously, the portion of the field insulation layer 205 not covered with the gate electrode 211 and the silicon nitride layer spacer 214 becomes thinner in the extent of 30 nm) (FIGS. 6A, 6B, 7A to 7C, 8B and 10B).

Next, by the method similar to the first embodiment, employing UHV-CVD device, after a natural oxide layer is formed on the exposed surfaces of the N$^-$ type diffusion layers 213a and 213b, N$^+$ type monocrystalline silicon layers 216a and 216b (as first silicon layer) in a thickness of 300 nm are formed in self-alignment with the exposed surface of the N$^-$ type diffusion layers 213a and 213b by anisotropic selective epitaxial growth with disilane in a flow rate of 2.0 sccm at a pressure of about $1\times10^{-2}$ Pa and a doping gas (1% of hydrogen phosphide diluted by hydrogen) in a flow rate of 0.2 sccm, at a temperature of 625° C. On the surface of the exposed N$^-$ diffusion layer 213a and 213b, N$^+$ type diffusion layers 215a and 215b having a junction depth of about 70 nm are formed.

The reason why the height of the N$^-$ type diffusion layers 213a and 213b in the shown embodiment can be lower than the height of the N$^-$ type diffusion layers 113a and 113b in the first embodiment to the extent of 400 nm is the difference in the structure of the isolating region.

Namely, in the second embodiment, the height of the upper surface of the silicon oxide layer 212 covering the upper surface of the gate electrode 211 provided on the active region 202 is substantially equal to the height of the upper surface of the silicon oxide layer cap 212 covering the upper surface of the gate electrode 211 (FIGS. 6A, 6B, 7A to 7C, 8C and 10C).

Anisotropic selective epitaxial growth method of the first monocrystalline silicon is preferably performed at a growth temperature in a range of 500° C. to 800° C. at a pressure in a range of $10^{-3}$ Pa to $5\times10^{-2}$ Pa. Anisotropic selective epitaxial growth of monocrystalline silicon layer is possible by employing mono silane (SiH$_4$) in place of disilane as material gas, the growth temperature should be shifted toward the higher temperature side in the extent of 80° C. to 100° C. than the case where disilane is used.

Next, after forming of the monocrystalline silicon layers 216a and 216b, N$^+$ type monocrystalline silicon layers 217a and 217b (as second silicon layers) of a thickness of about 100 nm are formed on the surface of the monocrystalline silicon layers 216a and 216b by isotropic selective epitaxial growth (see FIG. 5B) with disilane in a flow rate of about 4.0 sccm and a doping gas (1% of hydrogen phosphide diluted by hydrogen) in a flow rate of 0.4 sccm, at a temperature of 585° C. and at a pressure of bout $2 \times 10^{-2}$ Pa employing the foregoing UHV-CVD device (FIGS. 6A, 6B, 7A to 7C, 8D and 10D).

In the shown second embodiment similar to the first embodiment, instead of forming the (monocrystalline) silicon layer serving as the contact pad and directly connected to the exposed surface of the N⁻ type diffusion layers 213a and 213b in self-aligned manner by only anisotropic selective epitaxial growth, the monocrystalline silicon layer is formed by performing isotropic selective epitaxial growth after anisotropic selective epitaxial growth. Therefore, the silicon layer has a sufficient height, but not having the problem of the prior art process can be easily formed.

It should be noted that while the shown second embodiment sets the growth temperature of the monocrystalline silicon layer 217a and so forth at lower temperature than the growth temperature of the monocrystalline silicon layer 216a and so forth, the shown relationship of the growth temperatures of the monocrystalline silicon layers is not essential. Also, it should be appreciated that the second silicon layers to be formed on the surfaces of the monocrystalline silicon layers 216a and 216b are not specified to the monocrystalline silicon layer as in the shown embodiment. It is similarly possible to selectively grow N⁺ type polycrystalline silicon layers in place of the monocrystalline silicon layers 217a and 217b.

Subsequently, formation of the silicon oxide layer, formation of BPSG layer, reflow of the BPSG layer, CMP and so forth are performed to form the first interlayer insulation layer 221 of silicon oxide type insulation layer. Then, the node contact holes 222 extending through the interlayer insulation layer 221 and reaching the upper surface of the monocrystalline silicon layer 217b are formed.

The diameter of these node contact holes is about 0.25 μm (=F). Even when mis-alignment magnitude in the photo-lithographic process is significant, the bottom of the bit contact holes 222 may not protrude from the upper surface of the monocrystalline silicon layer 217b (FIGS. 6A, 6B, 7A to 7C, 9A and 11A).

Next, the node contact holes 222 are filled by contact plugs 223 of conductive layer, such as N⁺ type polycrystalline silicon layer and so forth. Then, N⁺ type polycrystalline silicon layer in the thickness of 800 nm is formed over the entire surface. Then, the N⁺ type polycrystalline silicon layer is patterned to form these storage node electrode 224.

It should be noted that the storage node electrodes 224 and the contact plugs 223 may be formed with the same N⁺ type polycrystalline silicon layer and through the same patterning process. Then, the capacitive insulation layer 225, such as ONO layer, is formed, and thereafter, cell plate electrodes 226 of N⁺ type polycrystalline silicon having layer thickness of 150 nm, are formed. Then, by anisotropic etching, the opening portion 227 of the diameter of 400 nm is formed in the cell plate electrode 226 immediately above the monocrystalline silicon layer 217b (FIGS. 6A, 6B, 7A to 7C, 9B and 11B).

Subsequently, the second interlayer insulation layer 231 of silicon oxide type insulation layer having flat upper surface is formed. Through the interlayer insulation layer 231, the capacitive insulation layer 225 and the interlayer insulation layer 221 in the portion where the opening portion 227 is formed, the bit contact hole 232 reaching the upper surface of the monocrystalline silicon layer 217b is formed. The diameter of the bit contact hole 232 is about F. Even when mis-alignment magnitude in the photolithographic process is significant, the bottom of the bit contact holes 232 may not protrude from the upper surface of the monocrystalline silicon layer 217b (FIGS. 6A, 6B, 7A to 7C, 9C and 11C).

Subsequently, the contact plug 223 of the conductive layer, such as N⁺ type polycrystalline silicon layer or so forth, fills the bit contact hole 232. For example, the conductive layer of tungsten silicide layer in the layer thickness of about 120 nm, or so forth is formed by sputtering. The conductive layer is patterned to form the bit lines 234. Also, the surface protective layer 241 is formed. Thus, the second embodiment of DRAM is completed (FIGS. 6A, 6B, and 7A to 7C).

It is easy to apply the second embodiment of the semiconductor device to the DRAM in COB structure. On the other hand, with respect to the DRAM of the normal stack structure (as applied in the second embodiment (differing lowering of effect)), it is possible to employ the first embodiment (to employ the isolating structure including LOCOS structure (localized oxidation of silicon)). On the other hand, while the first and second embodiments are directed to N-channel MOS transistor, the first and second embodiments can be applied to P-channel MOS transistor.

As set forth above, according to the present invention, in the reverse conductive type channel MOS transistor provided on one conductivity type silicon substrate having {100} face as the major surface, which has the reverse conductive type diffusion layer and a source and drain region including the reverse conductive. Type monocrystalline silicon layer serving as the contact pad provided in self-align manner on the surface of the reverse conductive type diffusion layer, the silicon oxide layer cap selectively and directly covering the upper surface of the gate electrode is provided, and the silicon nitride layer spacer directly covering the gate electrode and the side surface of the silicon oxide layer spacer is provided.

Furthermore, the first silicon layer of reverse conductivity type monocrystalline silicon directly connected to the surface of the reverse conductive type diffusion layer in self-alignment with the silicon oxide layer spacer, and the reverse conductive type second silicon layer extending up to the upper surface of the silicon oxide layer cap, are provided to form the source and drain region consisted of the first and second silicon layers and the reverse conductive type diffusion layer, and the first and second silicon layers serve as the contact pad.

The first silicon layer is formed by anisotropic selective epitaxial growth method, and the second silicon layer is consisted of the monocrystalline silicon formed by isotropic selective epitaxial growth method or polycrystalline silicon formed by selective growth method.

As a result, leak current and shorting between the wiring and gate electrode connected to the source and drain region via the contact hole as employed in the present invention, can be easily prevented, and the height of the monocrystalline silicon layer does not practically affect as in the prior art process.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. A semiconductor device comprising:
   an active region defined by an edge of <110> direction provided on the surface of one conductivity type silicon substrate having a major surface consisting of a {100} face;
   a localized oxidation of silicon type field oxide layer provided in an isolating region of the surface of said silicon substrate surrounding said active region;
   a gate electrode extending across the surface of said active region in <110> direction via a gate oxide layer provided on the surface of said active region;
   a silicon oxide layer cap directly covering the upper surface of said gate electrode;
   a silicon nitride layer spacer directly covering the side surface of said gate electrode and said silicon oxide layer cap;
   a reverse conductivity type source and drain region being constituted of a reverse conductivity type diffusion layer provided on the surface of said active region in self-alignment with said gate electrode and said field oxide layer, a first silicon layer of reverse conductivity type monocrystalline silicon, directly covering the surface of said reverse conductive type diffusion layer in self-alignment with said silicon nitride layer spacer and said field oxide layer and having a side surface consisting of a {110} face and an upper surface consisting of a {100} face as major surface, and a reverse conductivity type second silicon layer directly covering the upper surface and the side surface of said first silicon layer and extending at least over the upper surface of said silicon oxide layer cap and said field oxide layer;
   an interlayer insulation layer covering said field oxide layer, said silicon oxide layer cap, said silicon nitride spacer and said second silicon layer;
   a contact hole provided through said interlayer insulation layer and reaching the upper surface of said second silicon layer; and
   a wiring provided on the surface of said interlayer insulation layer and connected to said source and drain region via said contact hole.

2. A semiconductor device as set forth in claim 1, wherein said second silicon layer is formed of a monocrystalline silicon.

3. A semiconductor device as set forth in claim 1, wherein the minimum interval of said gate electrode and minimum diameter of said contact hole are equal to each other.

4. A semiconductor device as set forth in claim 1, wherein the minimum interval of said silicon nitride layer spacer belonging to adjacent gate electrodes and the minimum diameter of said contact hole are equal to each other.

5. A semiconductor device comprising:
   an active region defined by an edge of <110> direction provided on the surface of one conductivity type silicon substrate having a major surface consisting of a {100} face;
   a groove provided in an isolating region on the surface of said silicon substrate surrounding said active region;
   a field insulation layer filled in said groove;
   a gate electrode extending across the surface of said active region in <110> direction via a gate oxide layer provided on the surface of said active region;
   a silicon oxide layer cap directly covering the upper surface of said gate electrode;
   a silicon nitride layer spacer directly covering the side surface of said gate electrode and said silicon oxide layer cap;
   a reverse conductivity type source and drain region being constituted of a reverse conductivity type diffusion layer provided on the surface of said active region in self-alignment with said gate electrode and said field oxide layer, a first silicon layer of reverse conductivity type monocrystalline silicon, directly covering the surface of said reverse conductive type diffusion layer in self-alignment with said silicon nitride layer spacer and said field oxide layer and having a side surface consisting of a {110} face and an upper surface consisting of a {100} face as major surface, and a reverse conductivity type second silicon layer directly covering the upper surface and the side surface of said first silicon layer and extending at least over the upper surface of said silicon oxide layer cap and said field oxide layer;
   an interlayer insulation layer covering said field oxide layer, said silicon oxide layer cap, said silicon nitride spacer and said second silicon layer;
   a contact hole provided through said interlayer insulation layer and reaching the upper surface of said second silicon layer; and
   a wiring provided on the surface of said interlayer insulation layer and connected to said source and drain region via said contact hole.

6. A semiconductor device as set forth in claim 5, wherein said second silicon layer is formed of a monocrystalline silicon.

7. A semiconductor device as set forth in claim 5, wherein the minimum interval of said gate electrode and minimum diameter of said contact hole are equal to each other.

8. A semiconductor device as set forth in claim 5, wherein the minimum interval of said silicon nitride layer spacer belonging to adjacent gate electrodes and the minimum diameter of said contact hole are equal to each other.

9. A fabrication process of a semiconductor device comprising:
   step of forming a localized oxidation of silicon type field oxide layer in an isolating region surrounding an active region defined by an edge of <110> direction provided on the surface of one conductivity type silicon substrate having a major surface consisting of a {100} face;
   step of forming a gate oxide layer on the surface of said active region by thermal oxidation;
   step of forming a conductive layer over the entire surface;
   step of forming a silicon oxide layer covering said conductive layer;
   step of forming a gate electrode extending across the surface of said active region in <110> direction via said gate oxide layer and a silicon oxide layer cap directly covering the upper surface of said gate electrode by patterning said silicon oxide layer and said conductive layer;
   step of forming a reverse conductivity type diffusion layer on the surface of said active region using said gate electrode and said field oxide layer as a mask;
   step of forming a silicon nitride layer over the entire surface;

step of performing etching back of said silicon nitride layer by anisotropic etching to form a silicon nitride layer spacer directly covering said silicon oxide layer cap and the side surface of said gate electrode;

step of removing said gate oxide layer in self-alignment with said silicon nitride layer spacer and said field oxide layer;

step of forming a first silicon layer of reverse conductivity type monocrystalline silicon on the surface of said reverse conductive type diffusion layer by anisotropic selective epitaxial growth of monocrystalline silicon;

step of forming a reverse conductivity type second silicon layer directly covering the upper surface and the side surface of said first silicon layer and extending at least over the upper surface of said silicon oxide layer cap and said field oxide layer, by isotropic selective epitaxial growth method of monocrystalline silicon or selective growth method of polycrystalline silicon;

step of forming an interlayer insulation layer over the entire surface;

step of forming a contact hole through said interlayer insulation layer, said contact hole reaching the upper surface of said second silicon layer; and step of forming a wiring on the surface of said interlayer insulation layer and said wiring being connected to said source and drain region via said contact hole.

10. A fabrication process of a semiconductor device as set forth in claim 9, wherein said anisotropic selective epitaxial growth is performed using disilane ($Si_2H_6$) or mono silane ($SiH_4$) as a primary material gas.

11. A fabrication process of a semiconductor device as set forth in claim 10, wherein said second silicon layer is formed by isotropic selective epitaxial growth method of monocrystalline silicon employing the same primary material gas as said first silicon layer, and a growth temperature of said second silicon layer is lower than a growth temperature of said first silicon layer.

12. A fabrication process of a semiconductor device comprising:

step of forming a groove in an isolating region surrounding an active region defined by an edge of <110> direction provided on the surface of one conductivity type silicon substrate having a major surface consisting of a {100} face;

step of forming a field insulation layer by forming an insulation layer over the entire surface and removing said insulation layer, leaving said insulation layer within said groove;

step of forming a gate oxide layer on the surface of said active region by thermal oxidation;

step of forming a conductive layer over the entire surface;

step of forming a silicon oxide layer covering said conductive layer;

step of forming a gate electrode extending across the surface of said active region in <110> direction via said gate oxide layer and a silicon oxide layer cap directly covering the upper surface of said gate electrode by patterning said silicon oxide layer and said conductive layer;

step of forming a reverse conductivity type diffusion layer on the surface of said active region, using said gate electrode and said field insulation layer as a mask;

step of forming a silicon nitride layer over the entire surface;

step of performing etching back for said silicon nitride layer by anisotropic etching to form a silicon nitride layer spacer directly covering said silicon oxide layer cap and the side surface of said gate electrode;

step of removing said gate oxide layer in self-alignment with said silicon nitride layer spacer and said field insulation layer;

step of forming a first silicon layer of reverse conductivity type monocrystalline silicon on the surface of said reverse conductive type diffusion layer by anisotropic selective epitaxial growth of monocrystalline silicon;

step of forming a reverse conductivity type second silicon layer directly covering the upper surface and the side surface of said first silicon layer and extending at least over the upper surface of said silicon oxide layer cap and said field insulation layer, by isotropic selective epitaxial growth method of monocrystalline silicon or selective growth method of polycrystalline silicon;

step of forming an interlayer insulation layer over the entire surface;

step of forming a contact hole through said interlayer insulation layer, said contact hole reaching the upper surface of said second silicon layer; and step of forming a wiring on the surface of said interlayer insulation layer and said wiring being connected to said source and drain region via said contact hole.

13. A fabrication process of a semiconductor device as set forth in claim 12, wherein said anisotropic selective epitaxial growth is performed using disilane ($Si_2H_6$) or mono silane ($SiH_4$) as a primary material gas.

14. A fabrication process of a semiconductor device as set forth in claim 13, wherein said second silicon layer is formed by isotropic selective epitaxial growth method of monocrystalline silicon employing the same primary material gas as said first silicon layer, and a growth temperature of said second silicon layer is lower than a growth temperature of said first silicon layer.

* * * * *